(12) United States Patent
Mowry et al.

(10) Patent No.: US 7,713,763 B2
(45) Date of Patent: May 11, 2010

(54) TEST STRUCTURE FOR MONITORING PROCESS CHARACTERISTICS FOR FORMING EMBEDDED SEMICONDUCTOR ALLOYS IN DRAIN/SOURCE REGIONS

(75) Inventors: Anthony Mowry, Buda, TX (US); Casey Scott, Dresden (DE); Vassilios Papageorgiou, Austin, TX (US); Andy Wei, Dresden (DE); Markus Lenski, Dresden (DE); Andreas Gehring, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 73 days.

(21) Appl. No.: 12/132,014

(22) Filed: Jun. 3, 2008

(65) Prior Publication Data
US 2009/0166618 A1 Jul. 2, 2009

(30) Foreign Application Priority Data
Dec. 31, 2007 (DE) .................. 10 2007 063 229

(51) Int. Cl.
*H01L 21/00* (2006.01)
(52) U.S. Cl. .................. 438/14; 438/17; 438/18
(58) Field of Classification Search .................. 438/14, 438/17–18
See application file for complete search history.

(56) References Cited

U.S. PATENT DOCUMENTS

| | | | |
|---|---|---|---|
| 5,956,566 A * | 9/1999 | Lin et al. .................. | 438/17 |
| 6,342,401 B1 | 1/2002 | Tom .......................... | 438/17 |
| 6,498,384 B1 * | 12/2002 | Marathe .................... | 257/520 |
| 6,555,856 B1 * | 4/2003 | Staller ....................... | 257/252 |
| 6,599,761 B2 * | 7/2003 | Hess et al. ................. | 438/11 |
| 6,838,891 B2 * | 1/2005 | Ohya et al. ................ | 324/754 |
| 6,858,511 B1 * | 2/2005 | Marathe .................... | 438/361 |
| 7,078,690 B2 * | 7/2006 | Simon et al. ............... | 250/310 |
| 7,358,527 B1 * | 4/2008 | Masini et al. .............. | 257/48 |
| 7,494,596 B2 * | 2/2009 | Barnes et al. .............. | 216/27 |
| 7,494,893 B1 * | 2/2009 | Inani et al. ................ | 438/424 |
| 7,588,948 B2 * | 9/2009 | Lerner ....................... | 438/16 |
| 2003/0048112 A1 * | 3/2003 | Mori et al. ................ | 324/765 |
| 2003/0146381 A1 * | 8/2003 | Simon et al. ............... | 250/310 |
| 2005/0191768 A1 * | 9/2005 | Yoon et al. ................ | 438/7 |
| 2008/0182371 A1 * | 7/2008 | Gehring et al. ............ | 438/199 |
| 2008/0237588 A1 * | 10/2008 | Lehr .......................... | 257/48 |
| 2009/0166618 A1 * | 7/2009 | Mowry et al. ............. | 257/48 |

FOREIGN PATENT DOCUMENTS

| | | |
|---|---|---|
| DE | 10 2004 036 971 A1 | 3/2006 |
| DE | 10 2006 015 087 A1 | 10/2007 |
| KR | 100752188 B1 | 8/2007 |

OTHER PUBLICATIONS

Translation of Official Communication dated Oct. 23, 2008.

* cited by examiner

*Primary Examiner*—Laura M Menz
(74) *Attorney, Agent, or Firm*—Williams, Morgan & Amerson

(57) ABSTRACT

By providing a test structure for evaluating the patterning process and/or the epitaxial growth process for forming embedded semiconductor alloys in sophisticated semiconductor devices, enhanced statistical relevance in combination with reduced test time may be accomplished.

11 Claims, 15 Drawing Sheets

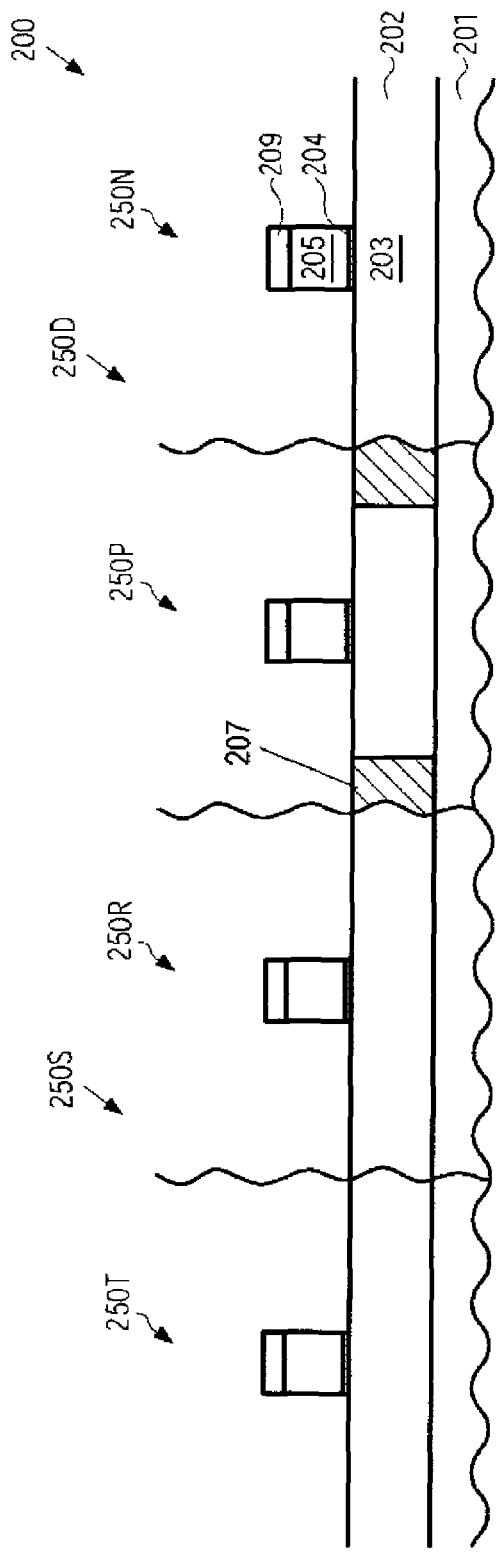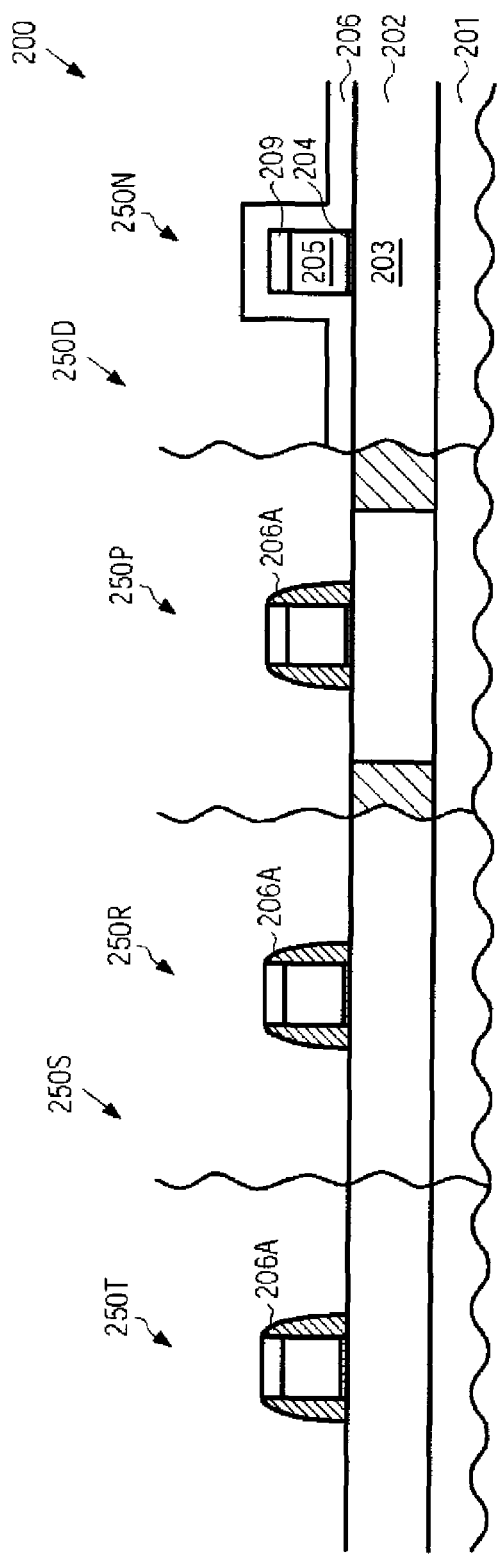

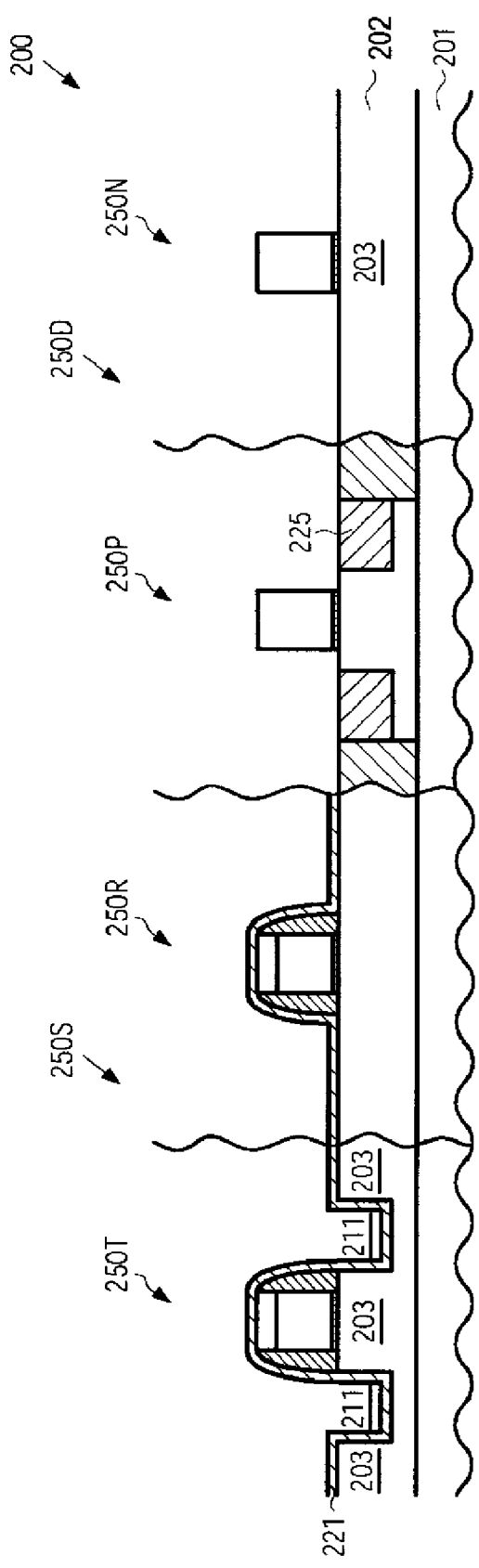
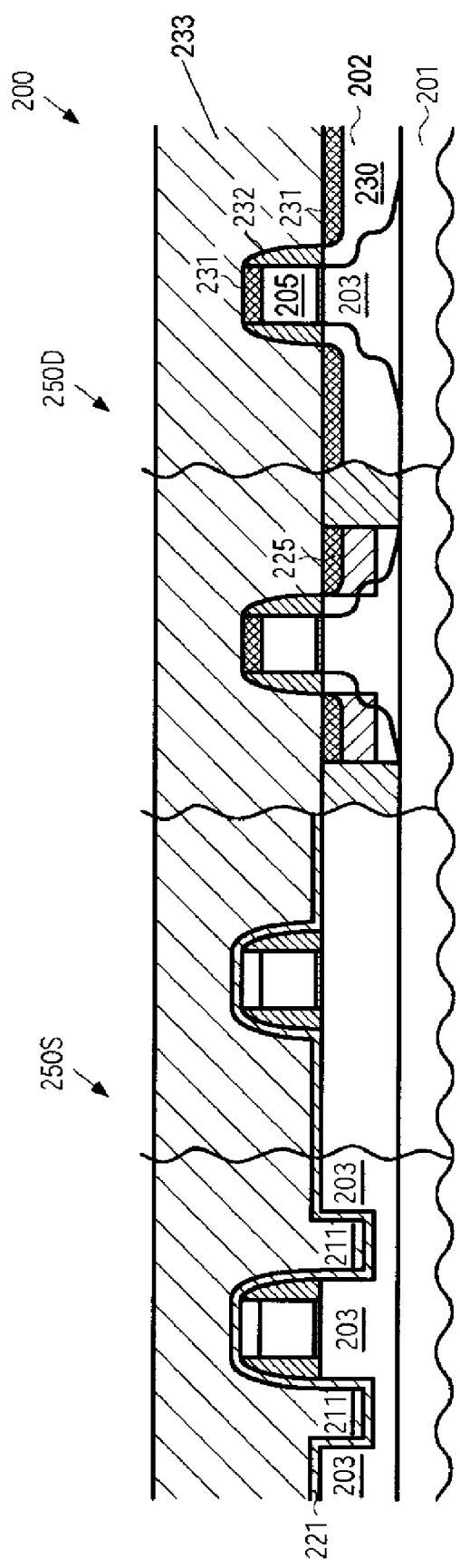

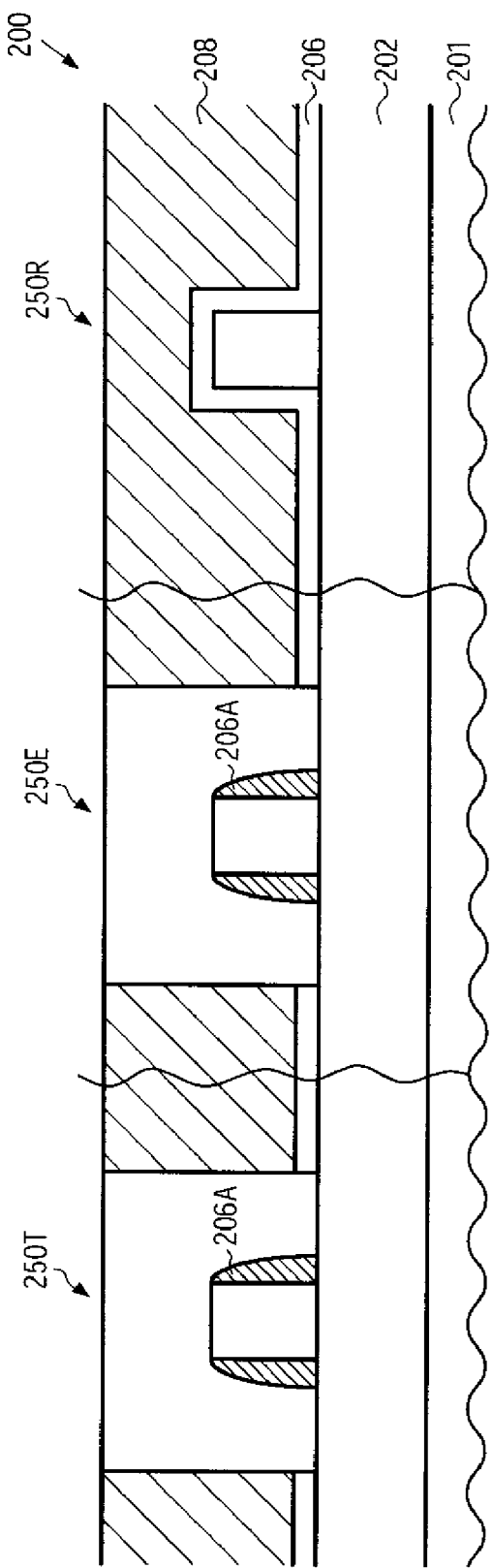
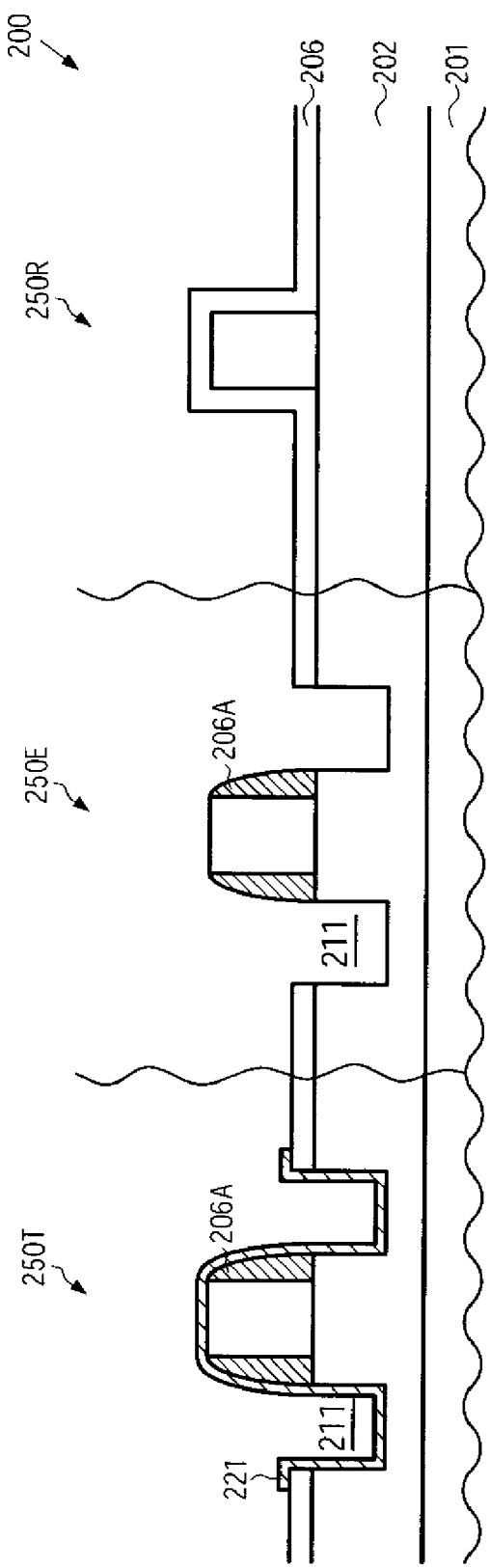
FIG. 2l
FIG. 2m

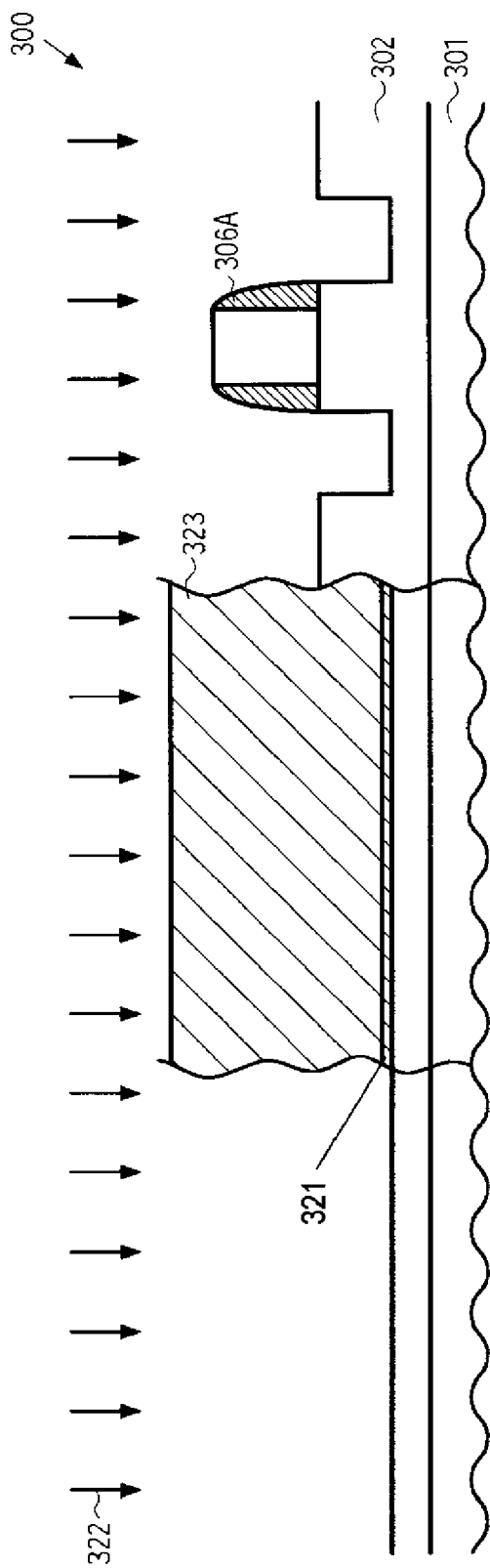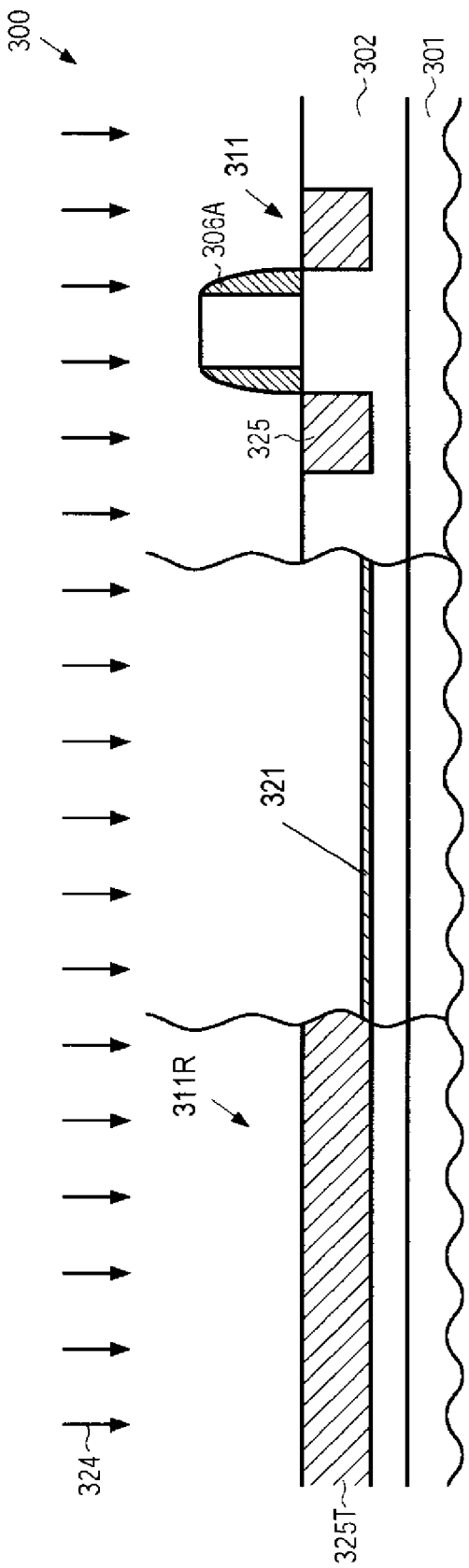

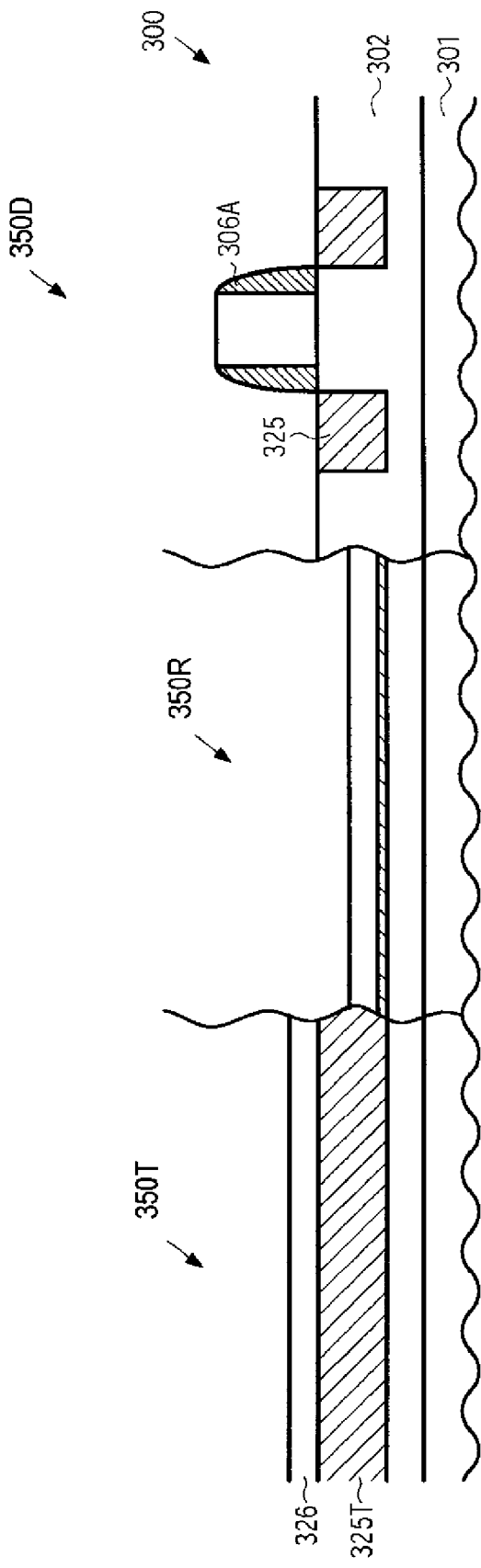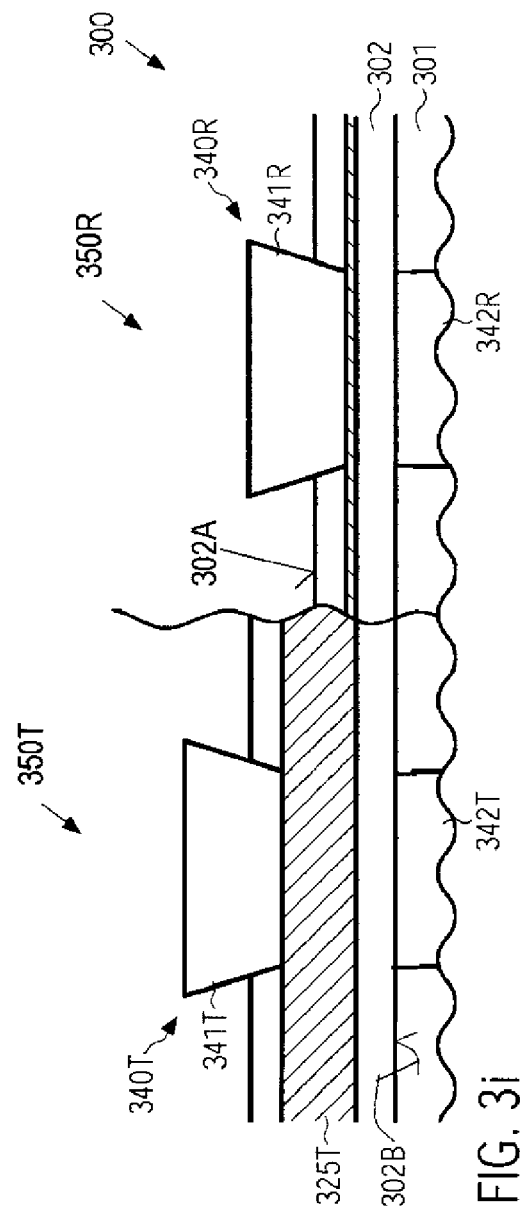

TEST STRUCTURE FOR MONITORING PROCESS CHARACTERISTICS FOR FORMING EMBEDDED SEMICONDUCTOR ALLOYS IN DRAIN/SOURCE REGIONS

BACKGROUND OF THE INVENTION

1. Field of the Invention

Generally, the present disclosure relates to the formation of integrated circuits, and, more particularly, to the formation of source/drain regions of transistors by using an embedded strain-inducing semiconductor material to enhance charge carrier mobility in the channel region of a MOS transistor.

2. Description of the Related Art

In integrated circuits, a great number of circuit elements are formed in and above an appropriate semiconductor layer, which, for the vast majority of semiconductor devices, is currently comprised of silicon, due to the virtually unlimited availability and the long-term experience gained over the last decades with respect to the processing of silicon and related materials. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with a lightly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, in view of increased integration density and performance enhancement of individual field effect transistors, the continuous reduction of the channel length has become a dominant criterion for designing integrated circuits.

The continuing shrinkage of the transistor dimensions, however, involves a plurality of issues associated therewith that have to be addressed so as to not unduly offset the advantages obtained by steadily decreasing the channel length of MOS transistors. Among others, the development or sophisticated adaptation of enhanced photolithography techniques, implantation processes, deposition techniques, etch processes and many other processes may be necessary with the advance to every new technology node. Moreover, reducing the channel length of the transistors may also require a reduction of the thickness of the gate insulation layer in order to maintain sufficient controllability of the channel region during operation of the device. For sophisticated transistor architectures, the thickness of gate insulation layers based on silicon dioxide materials have reached 2 nm or less, thereby rendering a further scaling of silicon dioxide based gate dielectrics a less than desirable strategy for future device generations due to the significant increase of gate leakage currents.

Therefore, it has been proposed to also enhance the channel conductivity of the transistor elements by increasing the charge carrier mobility in the silicon-based channel region for a given channel length, thereby offering the potential for achieving a performance improvement that is comparable with the advance to an advanced technology node while avoiding or at least postponing many of the above process developments and adaptations associated with device scaling. One efficient mechanism for increasing the charge carrier mobility is the modification of the lattice structure of the silicon in the channel region by, for instance, producing a corresponding strain in the channel region, which results in a modified mobility for electrons and holes, respectively. For example, creating tensile strain in the channel region of silicon-based transistor devices formed in a silicon layer of standard crystallographic characteristics increases the mobility of electrons, which in turn may directly translate into a corresponding increase in conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials and manufacturing techniques.

In one frequently employed approach, the hole mobility of PMOS transistors is enhanced by forming an embedded strained mixed silicon/germanium layer in the drain and source regions of the transistors, wherein the compressively strained drain and source regions create uniaxial strain in the adjacent silicon channel region. During the incorporation of the silicon/germanium alloy into the drain and source regions of the PMOS transistors, these regions are selectively recessed to form a cavity with a specified depth, while the NMOS transistors are masked. Subsequently, the silicon/germanium layer is selectively formed in the PMOS transistor by epitaxial growth. Although this technique offers significant advantages in view of performance gain of the PMOS transistor and thus of the entire CMOS device, the corresponding process flow for forming the recesses and for refilling the recesses by the desired semiconductor alloy may comprise a plurality of complex process steps, as will now described in more detail with reference to FIGS. 1a-1d.

FIG. 1a schematically illustrates a cross-sectional view of a semiconductor device 100, comprising a P-channel transistor 150p and an N-channel transistor 150n, which may be formed above a substrate 101 at appropriate substrate areas. In this manufacturing stage, the transistors 150p, 150n my each comprise a gate electrode 105, formed above a semiconductor layer 102 and separated therefrom by a gate insulation layer 104. Moreover, the respective gate electrodes may be covered by a capping layer 109, which is typically comprised of silicon nitride. As previously explained, the transistors 150p, 150n may represent field effect transistors of highly scaled semiconductor devices, wherein a gate length, i.e., the horizontal extension of the gate electrodes 105 in FIG. 1a, may be approximately 100 nm and significantly less. Consequently, in order to obtain an enhanced performance for the P-channel transistor 150p for a given gate length, strain may be created in the respective channel region 103 based on an embedded strained semiconductor layer to be formed adjacent to the gate electrode 105 of the P-channel transistor 150p, as will be described later on.

Typically, the semiconductor device 100 as shown in FIG. 1a may be formed according to the following processes. After forming a dielectric material for the gate insulation layers 104 by oxidation and/or deposition, and after the deposition of an appropriate gate electrode material, such as polysilicon, an advanced patterning process on the basis of photolithography and anisotropic etch techniques may be performed to obtain the gate electrodes 105 as shown. In order to provide a reliable encapsulation of the gate electrodes 105 during the further processing, an appropriate capping layer is usually deposited prior to the patterning of the gate electrodes 105, wherein a thickness of the corresponding capping layer may be selected such that an appropriate process margin is provided for the subsequent processing, that is, during the subsequent etch and epitaxial growth processes. Consequently, the capping layers 109 are provided on top of the gate electrodes 105 with a thickness corresponding to the process requirements, wherein, however, the thickness of the capping layers 109 may also be selected in accordance with requirements of the preceding patterning process, thereby also restricting the available range of thickness for the capping layers 109.

FIG. 1b schematically illustrates the semiconductor device 100 in a further advanced manufacturing stage. A spacer layer stack comprising a silicon dioxide liner 107 and a silicon nitride spacer layer 106 is conformally formed above the first and second transistors 150p, 150n. Moreover, a resist mask 108 is formed above the N-channel transistor 150n, while exposing the P-channel transistor 150p.

The liner 107 and the spacer layer 106 may be formed on the basis of well-established techniques, such as plasma enhanced chemical vapor deposition (PECVD) or low pressure chemical vapor deposition (LPCVD) and the like. During the formation of the liner 107, which will act as an etch stop layer during an anisotropic etch process 110 for patterning the spacer layer 106, an appropriate thickness of the layer 107 is selected with respect to a reliable protection of the capping layers 109 and the semiconductor layer 102 during a respective extended over-etch time of the process 110, which may be required due to pattern-dependent etch non-uniformities, which may also be referred to as microloading effects. Consequently, the initial thickness of the silicon dioxide liner 107 is selected in a range of approximately 10-20 nm in order to provide the required protection of the underlying materials during the anisotropic etch process 110.

Thereafter, the spacer layer 106, comprised of silicon nitride, may be deposited on the basis of LPCVD and the like, with a thickness required for reliably encapsulating the second transistor 150n during a subsequent selective epitaxial growth process and also to define a specific offset for a cavity etch in the P-channel transistor 150p. Thereafter, the resist layer 108 may be formed on the basis of well-established photolithography techniques. Then, the device 100 is subjected to the anisotropic etch process 110 in order to form respective sidewall spacers on the gate electrode 105 of the P-channel transistor 150p to provide the required encapsulation for the subsequent selective epitaxial growth process. During the etch process 110, appropriate process parameters for a highly anisotropic behavior of the etch process 110 may be obtained, for instance, on the basis of fluorine-containing reactive components in combination with a specific plasma ambient, while a high etch selectivity with respect to the material of the liner 107 is simultaneously achieved. The pronounced selectivity of the etch process 110 may, however, be associated with a certain degree of non-uniformity and sensitivity to pattern density of circuit elements formed across the entire substrate 101, thereby resulting in a moderately non-uniform etch result. Consequently, a certain amount of over-etch time in the process 110 is applied in order to reliably expose the liner 107 across the entire substrate 101. At the same time, exposure of the semiconductor layer 102 and/or the capping layers 109 is to be maintained at a low level in order to not unduly affect the uniformity of the subsequent cavity etch process. Thus, a more or less reduced uniformity of the oxide liner 107 after the completion of the etch process 110 may therefore also affect the finally obtained etch result in the subsequent cavity etch process. Additionally, the characteristics of the respective spacers formed during the anisotropic etch process 110, i.e., their finally obtained width, as well as the degree of coverage of the sidewalls of the gate electrode 105, may also be affected by the required over-etch time and thus the thickness of the spacer layer 106 and also of the capping layers 109 may not be selected independently from each other, but may have to be selected on the basis of the requirement for an efficient protection during the subsequent processing.

FIG. 1c schematically illustrates the semiconductor device 100 after the completion of the above-described process sequence and after a further plasma-based resist strip etch process for removing the resist mask 108. Hence, the device 100 comprises respective spacer elements 106A, including the liner 107 formed on sidewalls of the gate electrode of the P-channel transistor 150p, while the N-channel transistor 150n is still covered by the liner 107 and the spacer layer 106. As explained above, a respective spacer width 106W, as well as a residual thickness 107T of the liner 107 after the etch process 110, may depend on the specifics of the etch process and may vary due to the above-explained etch non-uniformities. Thereafter, the device 100 is subjected to a further etch process for removing the exposed portions of the residues of the liner 107, which may have a significantly reduced thickness, i.e., the thickness 107T, compared to the initial thickness, which may be accomplished on the basis of high frequency plasma-based techniques. Thereafter, the device 100 may be subjected to a cleaning process on the basis of an appropriate wet chemical chemistry for efficiently removing any contaminants resulting from the previous process steps. Any contaminants or surface irregularities, caused by the preceding etch processes, may otherwise significantly influence the subsequent cavity etch process, thereby resulting in non-uniformities, which may then also translate into respective non-uniformities during a subsequent selective epitaxial growth process.

FIG. 1d schematically illustrates the device 100 after the completion of the above-described process sequence, wherein, here, the device 100 is exposed to a further etch process 112 for forming a respective recess or cavity 111 adjacent to the gate electrode 105 on the basis of the sidewall spacers 106A. The etch process 112 may be designed as an isotropic etch process, an anisotropic etch process or as any mixture thereof, depending on the desired size and shape of the recess 111. Due to any process non-uniformities, especially during the etch process 110 for patterning the sidewall spacers 106A, the etch process 112 may also result in corresponding etch non-uniformities, i.e., the depth of the cavity 111 as well as the resulting surface roughness may vary across the substrate 101. Since the etch process 112 and thus the finally obtained depth and shape of the recess 111 may be controlled for a given etch recipe on the basis of the etch time only, any previously produced non-uniformities may significantly determine the finally obtained across-substrate uniformity in addition to any further process non-uniformities of the cavity etch process 112 itself.

After the etch process 112 and any cleaning processes for removing contaminants from exposed portions of the semiconductor layer 101, a corresponding selective epitaxial growth process may be performed in order to provide a strained semiconductor material in the recess 111, for instance, a silicon/germanium layer, thereby providing a desired degree of strain in the adjacent channel region 103. The selective epitaxial growth process is itself a highly complex process, the result of which may depend on a plurality of interrelated process parameters, such as flow rates, pressure, temperature, dopant species and the like. Consequently, in addition to any non-uniformities of the respective recesses 111, the strain generated by the epitaxially grown material and other characteristics thereof may be affected by a plurality of process parameters of the overall process flow. As a consequence, corresponding non-uniformity of transistor characteristics may result. For these reasons, sophisticated metrology procedures have been developed which strive to detect process fluctuations, for instance with respect to the complex cavity etch process and/or the selective epitaxial growth process. To this end, conventionally optical inspection techniques involving sophisticated and time-consuming evaluation procedures are employed. Due to the high complexity of these monitoring techniques, the amount of measurement data gathered is limited, since otherwise a significant loss of throughput would result.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to test structures and methods for forming and operating the same to enhance the monitoring and evaluation of materials and process characteristics in complex manufacturing regimes for forming semiconductor materials in an initial active region of transistor elements, for instance, in the form of strained semiconductor alloys and the like. For this purpose, the principles disclosed herein enable obtaining electrical measurement data, for instance, on the basis of resistance values and the like, thereby providing an efficient means for evaluating the materials and process regimes with high statistical relevance, while also significantly reducing the overall cycle times for obtaining the measurement data compared to conventional strategies, as previously discussed. Due to the highly efficient technique of obtaining electrical measurements data, for instance, on the basis of well-established automatic electrical test equipment, a plurality of measurement sites may be provided across the entire substrate, wherein specific parameters, such as the dimension of test features and their influence on the overall process characteristics, may be readily evaluated, substantially without contributing to an increase in measurement times, at least compared to conventional strategies, while a desired high degree of coverage across the entire substrate area may also be achieved to allow the detection of across-substrate non-uniformities of the process flow under consideration. For this purpose, a test region may be provided at a specified measurement site, such as the scribe line of semiconductor substrates, in which at least a portion of the overall process flow for forming an embedded semiconductor material, such as semiconductor alloys, may act on the test region, while efficiently "shielding" other processes that may otherwise have a substantial influence on the overall electrical characteristics of the test region. Furthermore, an appropriate contact structure may be formed in the test region to enable access by external measurement equipment at any appropriate manufacturing stage, wherein the contact structure is designed to provide electrical measurement data related to at least one electrical characteristic, such as the resistivity of a specified portion of the test region having experienced the part of the manufacturing sequence of interest, for instance, the formation of cavities, the volume of which, that is, the lateral size and/or the depth thereof, may have an influence on the overall electrical behavior in the test region, which may then be efficiently determined and evaluated with respect to parameters of interest. In some illustrative aspects, a reference region may be provided that is designed so as to substantially compensate for manufacturing related variations of process steps, which are not the subject of interest, such as forming the contact structures and the like.

One illustrative method disclosed herein comprises forming first cavities in a transistor area of a semiconductor layer and forming test cavities in a test region of the semiconductor layer, wherein the first cavities and the test cavities are formed in a common process. The method further comprises filling the first cavities with a semiconductor material, while masking a first one and a second one of the test cavities. Finally, the method comprises obtaining electrical measurement data from the test region by establishing a current flow through a first portion of the semiconductor layer comprising the first and second test cavities in order to evaluate the common process.

A further illustrative method disclosed herein comprises forming a first recess and a second recess in a semiconductor layer of a semiconductor device in a common patterning process, wherein the first and second recesses are located in a test region. Furthermore, the method comprises forming a semiconductor fill material in cavities of the semiconductor layer and in the first recess in a common fill process, wherein the cavities are located in a transistor area of the semiconductor device. Moreover, a first test contact structure is formed for establishing a current flow between the semiconductor fill material and a bottom portion of the first recess. Finally, the method comprises forming a second contact structure for establishing a current flow between a bottom face and a top face of a bottom portion of the second recess.

One illustrative test structure disclosed herein is designed for obtaining electrical measurement data. The test structure comprises a semiconductor layer formed above a substrate and a recess formed in the semiconductor layer. Furthermore, a strained semiconductor fill material is formed in the recess. Furthermore, a contact structure is provided that comprises a first test region. The first test region comprises a semiconductor layer formed above a substrate and a first cavity formed adjacent to and offset from a gate electrode structure that is formed above the semiconductor layer. Moreover, a second cavity is formed adjacent to and offset from the gate electrode structure at a side opposite to the first cavity. Finally, the first test region comprises a first contact structure configured to be accessed by an electrical test equipment, wherein the first contact structure is configured to enable a current flow through a bottom portion of the first and second cavities, and the first contact structure further comprises at least a first contact element and a second contact element defining a predetermined first lateral distance between each other. Moreover, the test structure comprises a first reference region, which in turn comprises a reference contact structure connecting to a non-recessed portion of the semiconductor layer. The reference contact structure is configured to be accessed by the electrical test equipment and comprises at least a first reference contact element and a second reference contact element, which define a second lateral distance between each other, the first and second lateral distances have a predefined correlation to each other.

BRIEF DESCRIPTION OF THE DRAWINGS

The disclosure may be understood by reference to the following description taken in conjunction with the accompanying drawings, in which like reference numerals identify like elements, and in which:

FIGS. 2a-2i schematically illustrate cross-sectional views of a semiconductor device during various manufacturing stages in forming a test structure, a reference structure and transistors including a strained semiconductor alloy, according to illustrative embodiments, in which assessment of a patterning process flow may be accomplished on the basis of electrical measurement data;

FIGS. 2l-2n schematically illustrate cross-sectional views of a test structure including different test regions and a reference region for evaluating a patterning process and an epitaxial growth process, according to further illustrative embodiments;

FIGS. 3a-3i schematically illustrate cross-sectional views of a semiconductor device during various manufacturing stages in forming a test structure, a reference structure and a transistor in order to enable an evaluation of material characteristics and/or process characteristics of an epitaxial growth process, according to further illustrative embodiments;

Figure 1A:
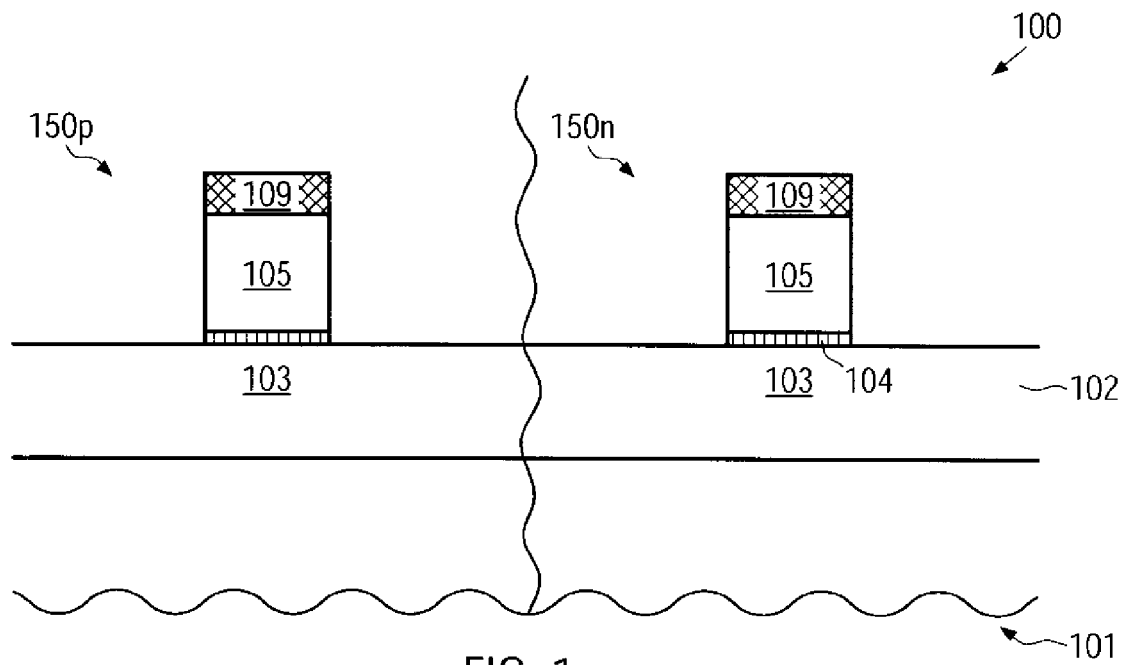
FIGS. 1a-1d schematically illustrate cross-sectional views of a semiconductor device at various manufacturing stages during the formation of cavities for receiving a strained silicon/germanium material therein, in accordance with conventional process techniques.
Figure 1B:
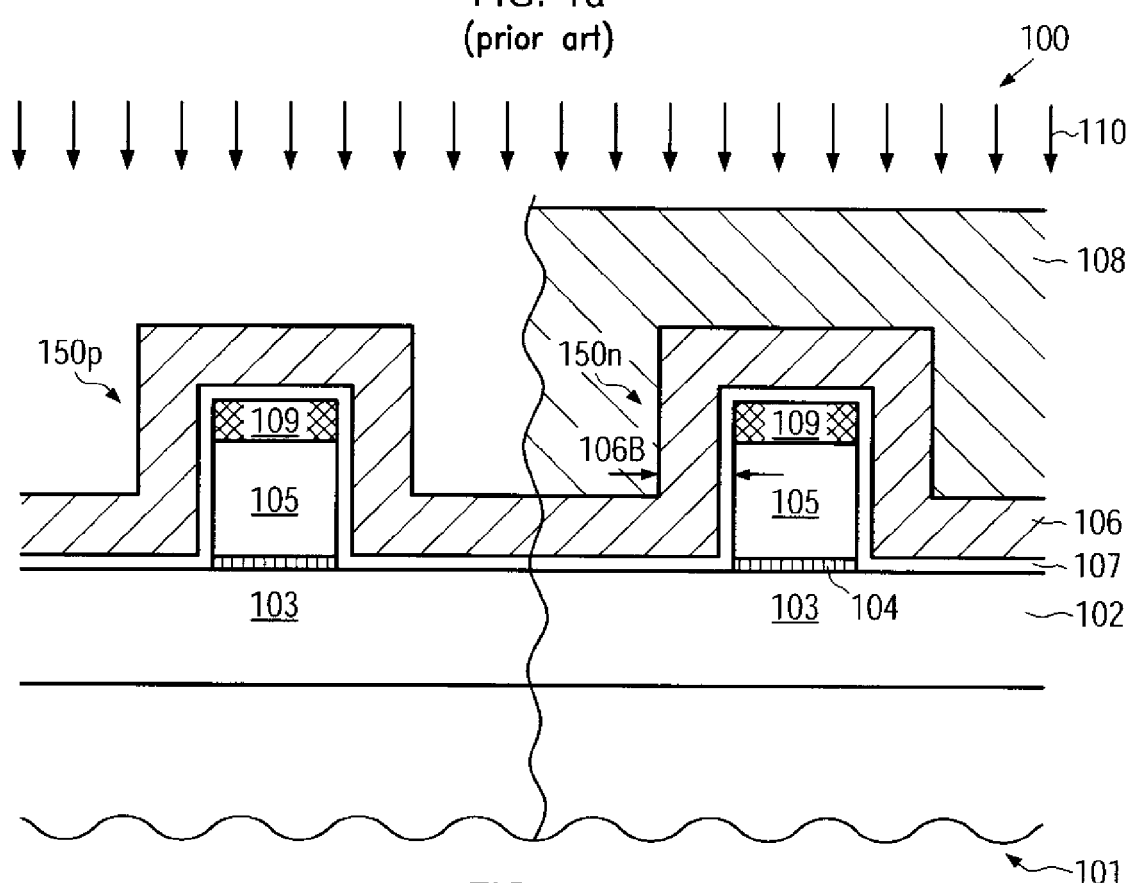
Figure 1C:
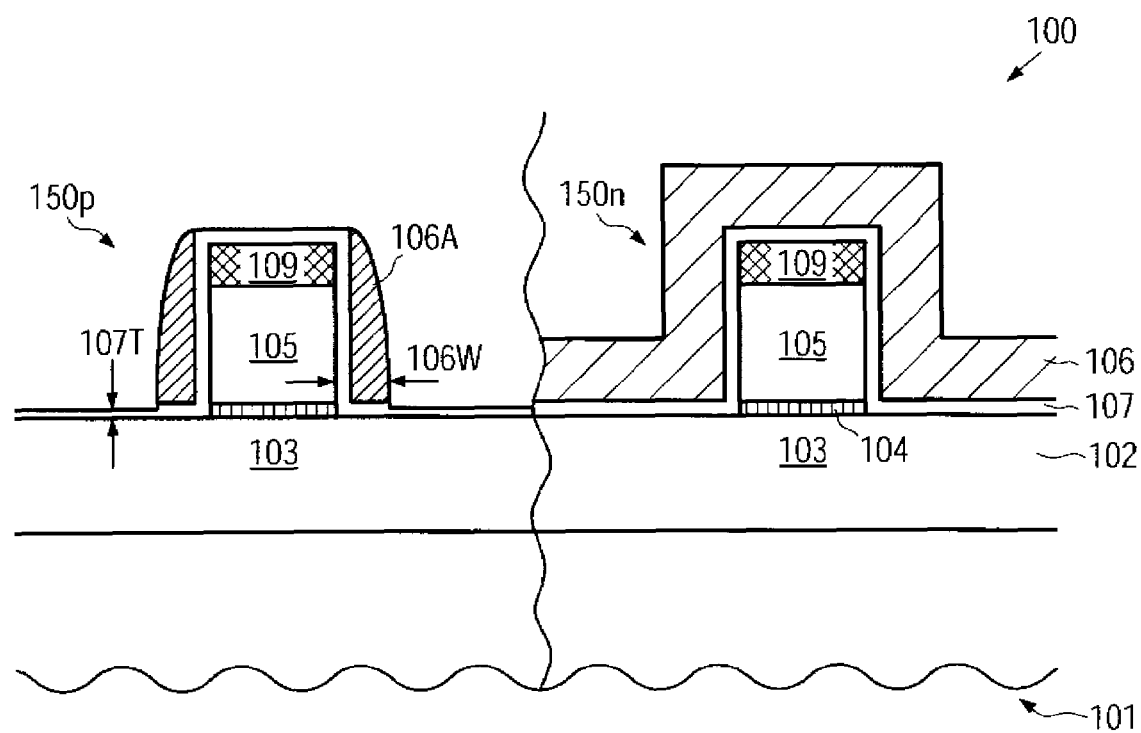
Figure 1D:
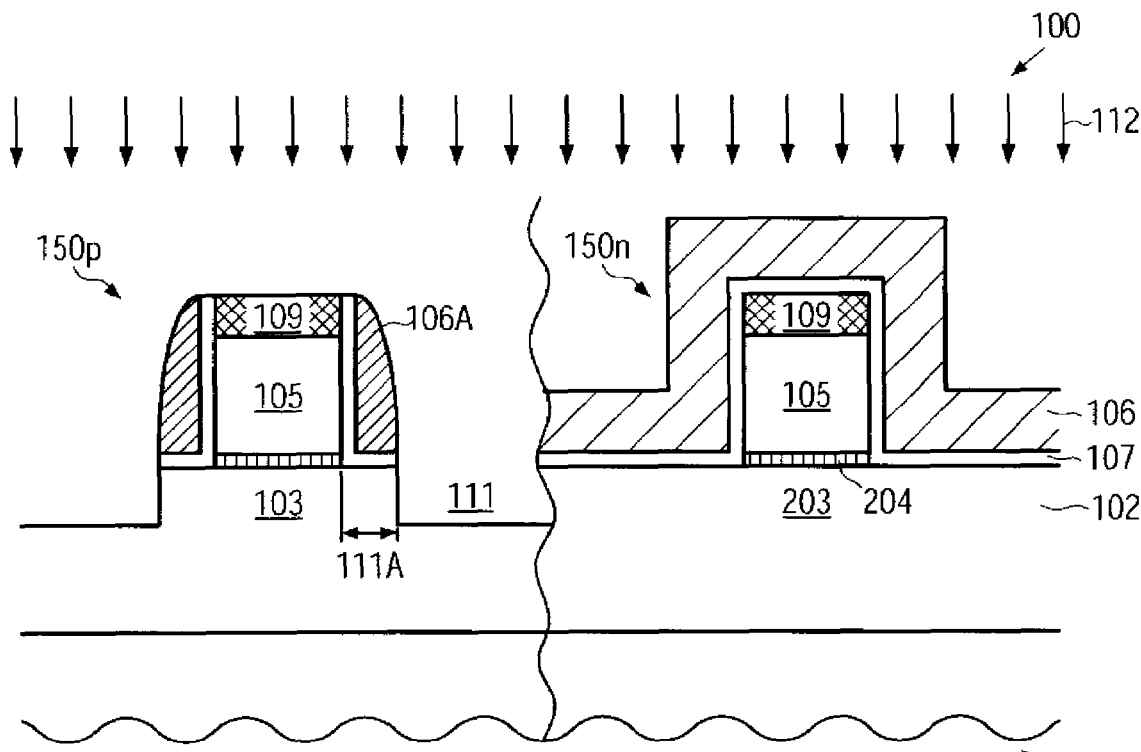

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to test structures and methods of forming the same which may be used for evaluating one or more process flow sequences in forming an embedded semiconductor material in drain/source areas of sophisticated transistor elements. Contrary to conventional strategies, the principles disclosed herein contemplate the provision of appropriate test structures which enable access by an electrical test equipment to obtain electrical measurement data, which in turn may be used for evaluating material characteristics and/or process flow characteristics during the patterning of cavities in transistor areas and/or during the deposition of a semiconductor material, such as silicon/germanium alloys, silicon/carbon alloys and the like, as may be required by sophisticated semiconductor devices. In some illustrative aspects disclosed herein, the test structure may be formed on the basis of a process flow having a high degree of compatibility with well-established semiconductor techniques, thereby reducing any additional process complexity. Consequently, the overall cycle time of respective semiconductor devices may be reduced compared to conventional regimes in which time-consuming optical analysis techniques, cross-sectional analyses and the like may have to be used. Furthermore, enhanced area coverage across the semiconductor substrate and enhanced statistical relevance may be accomplished, while the electrical testing of the test structures may also allow populating the semiconductor substrates with many structures of varying geometry and design rules to study the effects of many process sensitivities, such as microloading and etch effects, without significantly contributing to overall test time for the product under consideration. Consequently, a high degree of visibility may be gained with respect to the overall patterning process for forming cavities and refilling the same by an epitaxial growth process without requiring time-consuming inline optical measurements or even cross-sectional analyses by scanning electron microscopy and the like. Furthermore, in some illustrative aspects, appropriately designed reference structures may be provided, thereby accomplishing a high degree of robustness with respect to overall process changes and certain process fluctuations that may affect the test structure and the reference structure in substantially the same manner. Thus, a highly robust technique for evaluating material specific and process flow specific characteristics may be provided.

FIG. 2a schematically illustrates a cross-sectional view of a semiconductor device 200 comprising a substrate 201 having formed thereabove a semiconductor layer 202. The substrate 201, in combination with the semiconductor layer 202, may define a silicon-on-insulator (SOI) configuration, that is, the semiconductor layer 202 may be formed on an insulating material (not shown), while, in other cases, a bulk configuration may be defined, that is, the semiconductor layer 202 may represent an upper portion of a substantially crystalline semiconductor material of the substrate 201. Moreover, for the substrate 201 and the semiconductor layer 202, similar considerations may apply as previously explained with reference to the semiconductor device 100. The semiconductor device 200 may comprise a device region 250D in which circuit elements are formed, such as a transistor 250P and a transistor 250N, which may represent transistors receiving a different type of treatment in view of providing an embedded semiconductor material in the respective transistor active regions 203. For example, it may be assumed that the transistor 250P is to receive an embedded semiconductor material, wherein the material, a part of the manufacturing sequence or the entire manufacturing sequence for forming the same has to be monitored or evaluated on the basis of electrical measurement data, while the transistor 250N is to represent a circuit element that may not receive an embedded semiconductor material or a respective material may be formed according to other manufacturing strategies, which may be evaluated separately. The transistors 250P, 250N may comprise, in this manufacturing stage, a gate electrode structure 205 including a gate insulation layer 204 and a cap layer 209, similarly as is also explained with reference to the device 100. Furthermore, the active regions 203 may be defined by respective isolation structures 207, which, for convenience, are shown in the transistor 250P only.

Moreover, the semiconductor device 200 may comprise a test area 250S, which may be positioned at any appropriate location across the substrate 201. For example, the area 250S may be positioned within a scribe line of the substrate 201 so as to not unduly consume valuable semiconductor area in actual device regions. In the embodiment shown, the area 250S may represent a test structure, which may include a test region 250T, which may also comprise the gate electrode structure 205 as in the device region 250D. Furthermore, in some illustrative embodiments, a reference region 250R may also be provided, which may also comprise the gate electrode structure 205.

The semiconductor device 200 as shown in FIG. 2a may be formed on the basis of similar process techniques as previously described with reference to the device 100. It should be appreciated, however, that respective changes in the photolithography masks may have to be made to also define the test region 250T and the reference region 250R. It should be appreciated that, in some illustrative embodiments, the reference region 250R may be formed without the gate electrode structure 205, if this is considered appropriate for the further manufacturing process. After forming the gate electrode structures 205, a spacer material may be deposited, as previously explained, possibly in combination with an etch stop liner, and an appropriate etch sequence may be performed to form appropriate spacer elements for the gate electrode structure 205 of the transistor 250P, while covering the transistor 250N, as previously explained when referring to the device 100. Furthermore, respective spacer elements may also be formed in the test region 250T and the reference region 250R.

FIG. 2b schematically illustrates the semiconductor device 200 after having completed the above-described process sequence. That is, a spacer layer 206 may be provided above the transistor 250N, while corresponding spacer elements 206A may be formed in the remaining device regions. It should be appreciated that, if required, an appropriate etch stop liner material, such as the liner 107 previously described, may be provided.

Figure 2C:
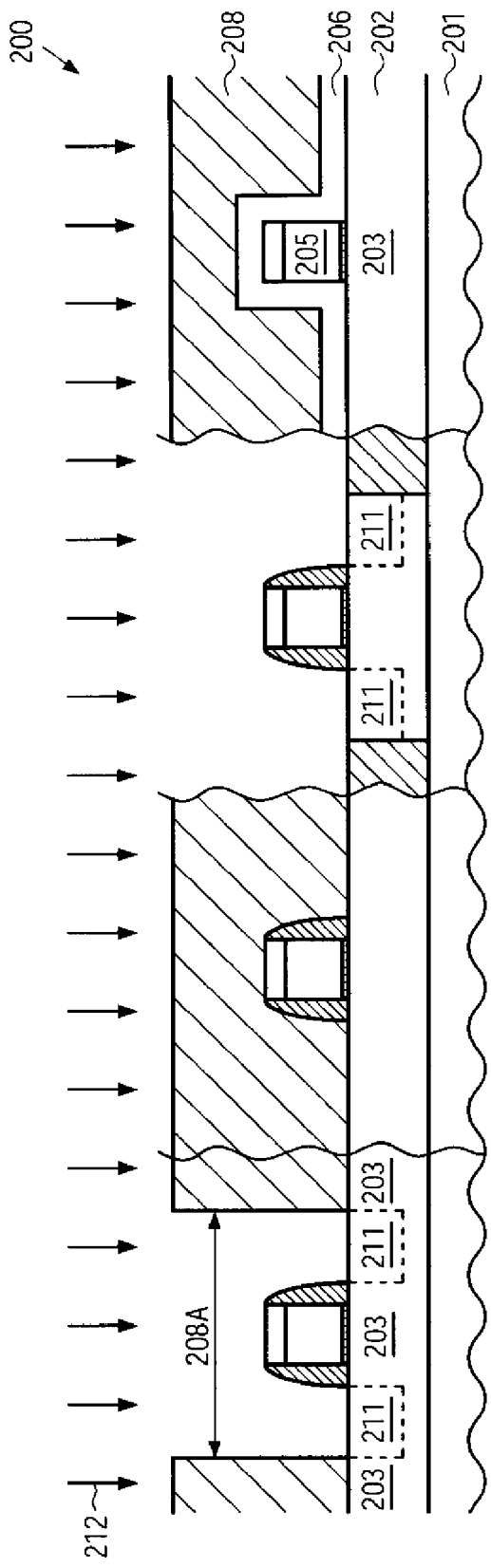

FIG. 2c schematically illustrates the semiconductor device 200 in a further manufacturing stage, in which an etch mask 208, such as a resist mask, may be provided to cover the device 250N, while exposing the transistor 250P. Furthermore, the etch mask 208 may be configured to cover the reference region 250R, while exposing a portion of the test region 250T. That is, an opening 208A of the etch mask 208 may be dimensioned such that a desired portion of the active area 203, i.e., the semiconductor layer 202 in the test region 250T, may be exposed to an etch ambient 212 designed to selectively etch the material of the semiconductor layer 202. In some illustrative embodiments, the opening 208A may have a lateral size that may substantially correspond to the lateral size of the transistor 250P, i.e., the size of the opening 208A may substantially correspond to the length of the transistor 250P. In this case, similar etch conditions may be encountered in the test region 250T and the transistor 250P. In other cases, the lateral dimension of the opening 208A may be less critical, since the characteristics of the etch process 212 may be evaluated on the basis of the etch result in the test region 250T, wherein a strong correlation may be assumed between the etch process in the test region 250T and the transistor device 250P. Thus, even if the etch results may differ in these regions, when significantly different lateral sizes may be used, nevertheless, an efficient characterization of the etch process 212 may be accomplished. Thus, the etch mask 208 may define, by means of the opening 208A, a region exposed to the etch process 212, while nevertheless maintaining sufficient semiconductor material 203 adjacent to the exposed area of the layer 202, which may enable the formation of a contact structure in a reliable manner, as will be explained later on in more detail. Consequently, the etch ambient 212 may result in material removal of exposed portions of the semiconductor layer 202, thereby forming respective cavities 211, as is also described with reference to the semiconductor device 100. It should be appreciated that the size of the respective cavities 211, i.e., the lateral dimension and the depth of the cavities, are determined by the sidewall spacers 206A and thus by the corresponding patterning process, as previously explained, and by the characteristics of the etch process 212. That is, depending on the etch recipe used, a more or less isotropic behavior may be obtained, thereby influencing the shape of the cavities 211, and hence the cavities 211 in the test region 250T may have "encoded" therein the characteristics of the previously performed patterning process for forming the spacers 206A and the etch process 212. It should be appreciated that a certain degree of under-etching of the etch mask 208 in the test region 250T may nevertheless enable a reliable assessment of the overall process sequence for patterning the cavities 211, even if a corresponding under-etching in the device region 250P may not occur due to the presence of the isolation structures 220.

Figure 2D:
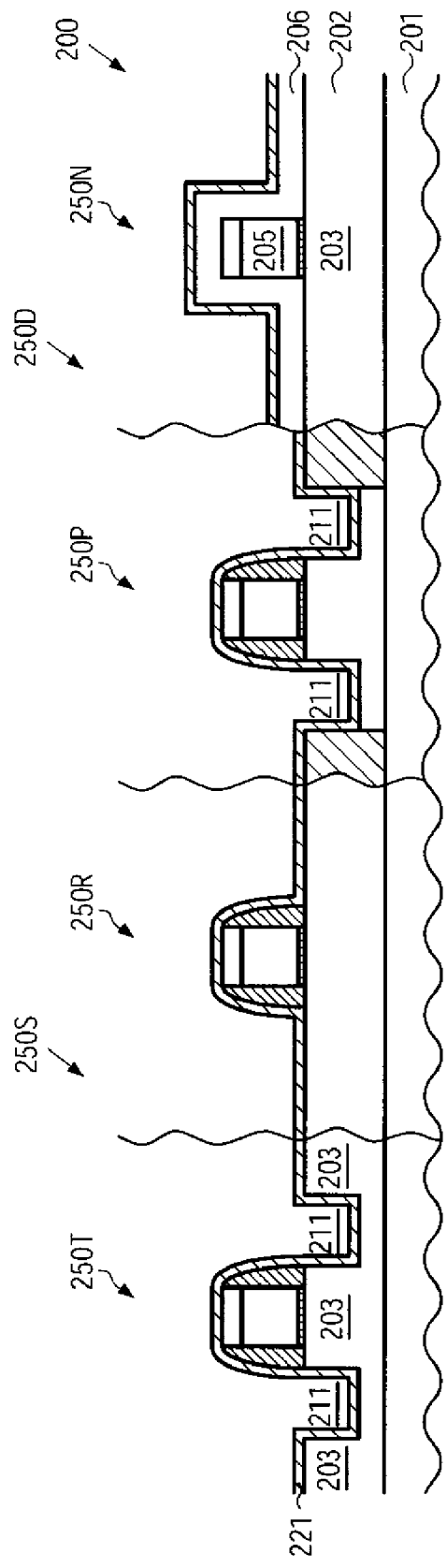

FIG. 2*d* schematically illustrates the semiconductor device 200 after the removal of the etch mask 208. Furthermore, a protection layer 221, for instance comprised of silicon dioxide or any other appropriate material, may cover the device 200.

Figure 2E:
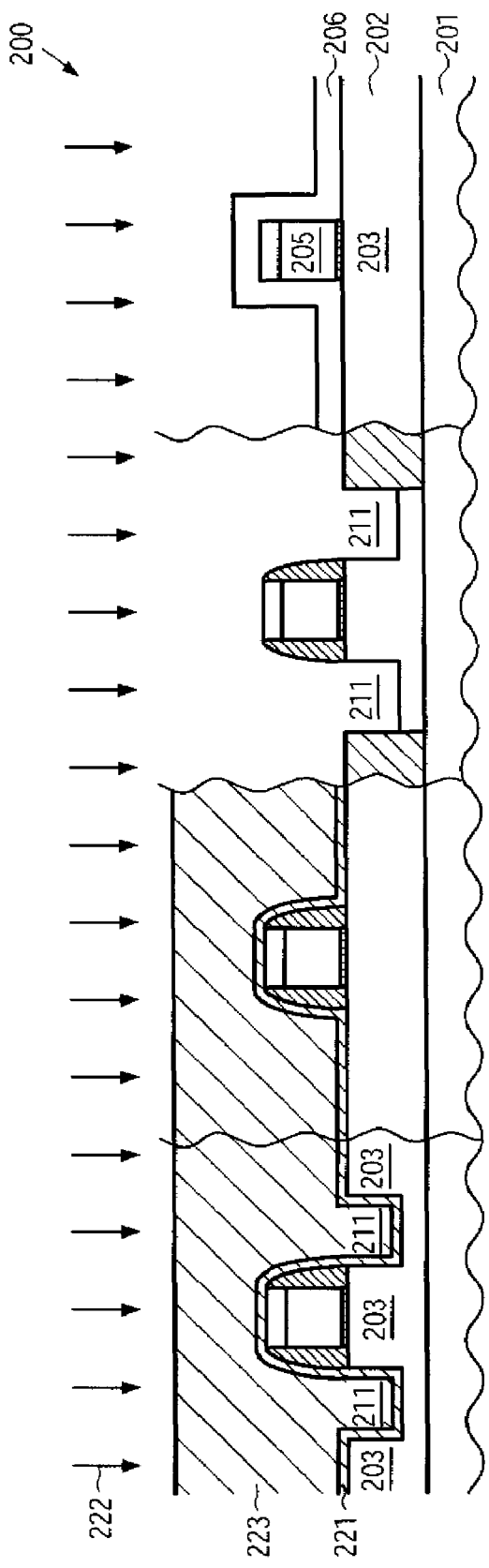

FIG. 2*e* schematically illustrates the semiconductor device 200 during a further etch process 222 that is designed as a highly selective etch process, for instance, a wet chemical process, a plasma-based process and the like, in order to selectively remove the layer 221 from above the devices 250P, 250N, while the test area 250S may be covered by an etch mask 223, such as a resist mask. It should be appreciated that respective selective etch recipes are well established in the art, for instance, for materials, such as silicon dioxide, silicon nitride and silicon. Consequently, the material of the layer 221 may be efficiently removed from the cavities 211 of the device 250P without significantly affecting the overall characteristics of the semiconductor material 203.

Figure 2F:
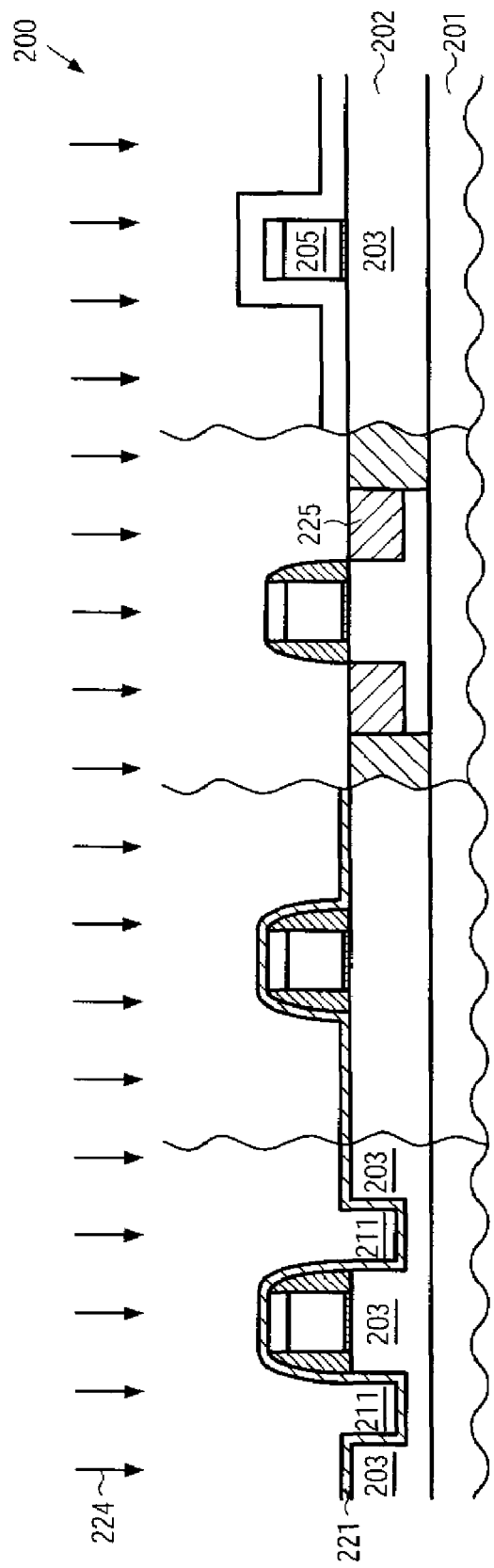

FIG. 2*f* schematically illustrates the semiconductor device 200 during an epitaxial growth process 224 that is designed to selectively deposit a desired semiconductor material on exposed surface portions of the semiconductor layer 202, while substantially avoiding significant material deposition on exposed dielectric portions, such as the layer 206, the side wall spacers 206A, the cap layers 209 and the protection layer 221. For example, the epitaxial growth process 224 may result in the deposition of a semiconductor material having a different natural lattice constant compared to the material of the semiconductor layer 202, thereby resulting in a strained growth of the semiconductor material deposited, as indicated by reference numeral 225. For instance, as previously explained, silicon/germanium material may frequently be used to obtain a compressive strained fill material 225, which may then act on the semiconductor material below the gate electrode structure 205 in order to create a desired strain therein. In other cases, the semiconductor material 225 may have any other appropriate composition, for instance, comprising tin in addition to or alternatively to germanium or by comprising carbon, which may result in a tensilely strained material. By providing the protection layer 221, a significant deposition of material 225 in the test region 250T may be avoided, thereby allowing the evaluation of the patterning sequence for forming the cavities 211 therein on the basis of electrical measurements, as will be explained later on in more detail. In other illustrative embodiments, as will be described later on, a further test region may be provided, in which the material 225 may also be deposited in respective cavities so as to enable the evaluation of the process 224 and/or of the characteristics of the material 225.

FIG. 2*g* schematically illustrates the device 200 after a further etch process for selectively removing the spacers 206A and the layer 206 in the device region 250D. For this purpose, any appropriate selective etch chemistry may be used as is well established in the art. For example, phosphoric acid may be used for selectively removing silicon nitride with respect to silicon dioxide and silicon and silicon-containing semiconductor alloys, such as silicon/germanium, silicon/carbon and the like.

FIG. 2*h* schematically illustrates the semiconductor device 200 in a further advanced manufacturing stage. As shown, the transistor structures in the device region 250D may be completed. That is, the transistors 250N, 250P may comprise drain and source regions 230 in an appropriate configuration as required by the specific type of transistor, such as N-channel transistor, P-channel transistor and the like. Furthermore, respective metal silicide regions 231 may be formed in the drain and source regions 230 and on top of the gate electrode structures 205. Furthermore, depending on the overall process strategy, respective spacer structures 232 may be formed on sidewalls of the gate electrode structures 205.

The transistors 250P, 250N may be formed on the basis of well-established process strategies, such as defining the drain and source regions 230 on the basis of ion implantation, using the spacer structure 232 at an appropriate manufacturing stage as an efficient implantation mask. It should further be appreciated that the corresponding masking regimes for providing the desired type of dopant species in the device region 250D may be accompanied by an appropriate masking of the test layer 250S, thereby substantially avoiding the incorporation of dopant species, which may otherwise unduly affect the overall electrical characteristics of the semiconductor layer 202 in the test area 250S. Similarly, the formation of the metal silicide regions 231 may be restricted to the device region 250D, thereby also substantially avoiding any influence on electrical characteristics within the test area 250S. Consequently, the electrical characteristics of the semiconductor layer 202 in the test area 250S are substantially determined by processes performed prior to and during the patterning sequence for forming the recesses 211. Furthermore, except for the patterning process 211, all of the previous and subsequent treatments have been performed for the test region 250T and the reference region 250R in a similar manner, wherein a high degree of similarity may be obtained by positioning these regions physically in close proximity to each other. After the completion of the transistor structures in the device region 250D, an interlayer dielectric material 233 may be formed in accordance with conventional process strategies. It should be appreciated that the interlayer dielectric material 233 may have any appropriate configuration, that is, it may comprise a plurality of different material layers, as is required by conventional manufacturing strategies. If, for example, a stressed dielectric material may be incorporated in the layer 233, appropriate stress-relaxing techniques may be selectively performed in the test area 250S, when a corresponding stress may be considered inappropriate for the electrical characteristics of the semiconductor material 202 in the device area 250S. Next, contact elements may be formed in the interlayer dielectric material 233 in accordance with well-established process techniques, wherein the corresponding patterning regime may be appropriately adapted to also form contacts to the test region and the reference region 250T, 250R. That is, in some illustrative embodiments (not shown), the layer 221 may be removed from the test area 250S, for instance, by an appropriate masking step and a selective etch process, as previously described. Thereafter, the interlayer dielectric material 233 may be formed in the same way as in the device region 250D. In other illustrative embodiments, the final phase of the etch process for forming the respective contact openings may be adapted to take into consideration the presence of the layer 221. For instance, a contact etch stop layer, for instance comprised of silicon nitride (not shown), may typically be provided followed by silicon dioxide material. In this case, after patterning the silicon dioxide material, the contact etch stop layer may be opened, wherein the metal silicide regions 231 may act as an efficient etch stop material, while in the test area 250S, the material 221 may act as an etch stop material, which may then be opened on the basis of an appropriate etch chemistry.

Figure 2I:
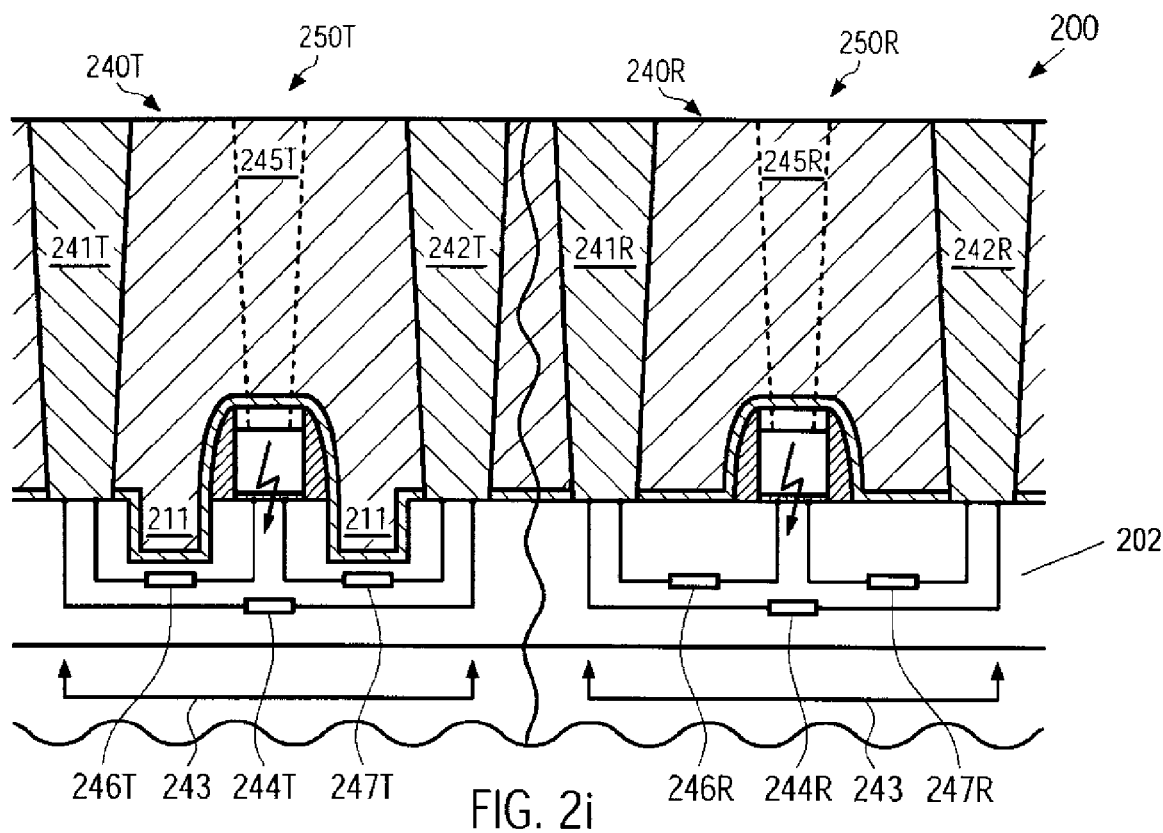

FIG. 2*i* schematically illustrates the semiconductor device 200 in a further advanced manufacturing stage after forming a respective contact, wherein, for convenience, only the test region 250T and the reference region 250R are illustrated. As shown, the test region 250T may comprise a contact structure 240T, which may include at least a first contact element 241T and a second contact element 242T, each of which may connect to the semiconductor material of the layer 202 adjacent to the cavities 211, which are filled by the interlayer dielectric material. The contact elements 241T, 242T may be formed such that the contacts may be positioned reliably outside the cavities 211 so as to define a lateral distance 243. Consequently, the remaining semiconductor material provided between the contact elements 241T, 242T may therefore represent a resistor, the resistance value of which may depend on the basic configuration of the semiconductor material of the layer 202 and the size of the cavities 211, i.e., the amount of semiconductor material removed during the patterning process for forming the cavities 211. A corresponding resistance value is schematically illustrated as a resistor 244T. In some illustrative embodiments, the contact structure 240T may also comprise a contact element 245T, which may connect to the gate electrode structure 205. Also, in this case, respective resistance values may be defined between the contact element 245T and the elements 241T, 242T, as indicated by the resistors 246T and 247T. It should be appreciated that, in the manufacturing stage shown, the gate insulation layer 204 may also be incorporated in the resistors 246T, 247T and may even represent the main contribution to the overall resistance value. However, if required, the gate insulation layer 204 may intentionally be destroyed or damaged in a reproducible manner, for instance, by applying a high voltage in a later manufacturing stage or during the test procedure. In this case, the respective resistors 246T, 247T are substantially determined by the remaining material of the semiconductor layer 202 positioned below the cavities 211.

Similarly, a contact structure 240R may be provided in the reference region 250R. The reference contact structure 240R may comprise a first contact element 241R, a second contact element 242R, which may be formed to define a specified lateral distance therebetween, which may have a predefined correlation to the distance 243 of the contact structure 240T. In one illustrative embodiment, the lateral distance of the contacts 241R, 242R may be based on the same design value corresponding to the distance 243. Consequently, since the contact structures 240T, 240R may be formed on the basis of the same processes and with the same design values with respect to size and distance, the electrical characteristics of the contact structures 240T, 240R may be very similar. Hence, a resistance value, indicated as 244R, may be defined in the reference structure 250R, which depends on characteristics of the contact structure 240R and characteristics of the semiconductor material of the layer 202. Furthermore, if desired, a further contact 245R may be provided to connect to the gate electrode structure 205, thereby also defining respective resistance values 246R, 247R. With respect to the gate insulation layer 204, the same criteria apply as previously explained.

It should be appreciated that appropriate contact elements, similar to the contact elements 241T, 245T, 242T and the like, may also be provided in the device region 250D. After forming the contact structures 240T, 240R and respective contacts in the device region 250D, the further process may be continued on the basis of well-established process regimes for forming metallization layers for appropriately interconnecting the respective circuit elements in accordance with the circuit layout. During the formation of the metallization structure, appropriate connections are also formed to the contact structures 240T, 240R, which may finally connect to respective contact pads (not shown), which may have any appropriate size so as to be accessible by external electrical test equipment, as is well known in the art.

Thus, at any appropriate manufacturing stage, in which respective contact pads are available and may be accessed by electrical test equipment, electrical measurement data may be obtained from a test region 250T and the reference region 250R, for instance, by establishing a current flow to determine the respective resistance values in these regions. For example, the resistance values of the resistors 244T and 244R may be determined, for instance, by applying a specified voltage and measuring the resulting current flow or by establishing a specified current flow and determining the voltage required. From respective electrical measurement data, the contribution of the cavities 211 may be determined by "subtracting" respective measurement values in any appropriate manner, thereby substantially eliminating the contribution of the respective contact structures. The resulting difference may substantially indicate the influence of the cavities 211 on the electrical characteristic, such as the overall resistance value, thereby enabling establishing a correlation between the electrical measurements data and the size or volume of the cavities 211 since the size of the cavities 211 in the test region 250T may be substantially determined by the respective manufacturing processes for forming the spacers 206A including the etch process 212. Hence, as previously explained, the electrical measurement data may enable an efficient and reliable evaluation of the corresponding process sequence.

Figure 2J:
FIG. 2j schematically illustrates a dependency of cavity volume on measured electrical resistance, according to illustrative embodiments.

FIG. 2j schematically illustrates in a simplified manner a corresponding relationship between the cavity volume, plotted along the vertical axis, and a representative resistance value, obtained on the basis of the structure 250T and 250R in any appropriate manner. That is, from the plurality of resistance values 244T, 246T, 247T and 244R, 246R, 247R, appropriate mean values and the like may be calculated and may be used as a measure for the cavity volume and thus as a measure for the status of the respective manufacturing sequence.

It should be appreciated that an evaluation of the manufacturing sequence may also be accomplished by providing the test structure 250T only, without providing the reference region 250R, if respective variations in forming the contact structure 240T may be considered negligible. Furthermore, in some illustrative embodiments, evaluating the manufacturing sequence for forming the cavities 211 may also include a "calibration" of the electrical measurement data obtained by the regions 250T, 250R by performing optical measurements and/or cross-sectional analysis techniques so as to obtain "absolute" values, for instance, for the depth of the cavities and the like, wherein the respective absolute measurements may have to be performed only once or with a significantly reduced frequency compared to conventional strategies. However, in other cases, a calibration of the electrical measurement data may not be required and the electrical measurement data may serve as a direct measure for the evaluation of process-specific characteristics of the manufacturing sequence under consideration.

Figure 2K:
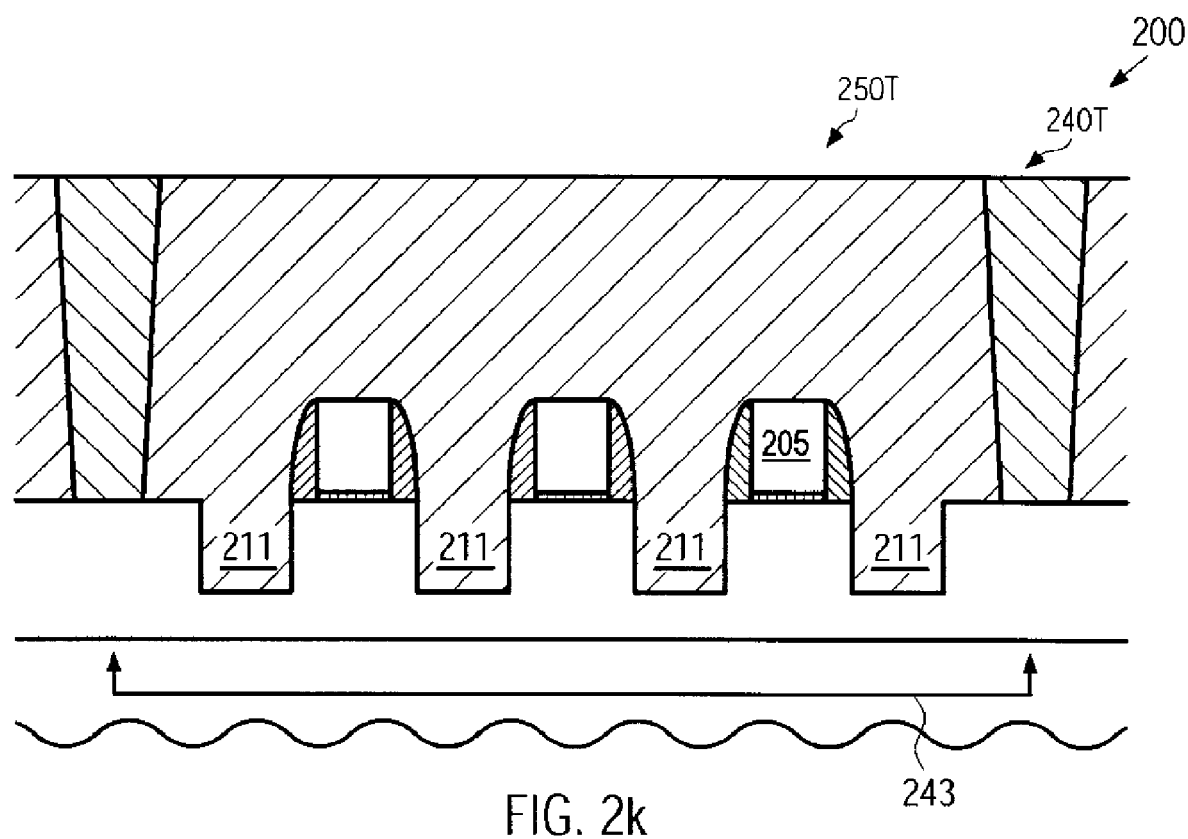
FIG. 2k schematically illustrates a cross-sectional view of a test region including a plurality of test features to obtain a "mean" value, according to illustrative embodiments.

FIG. 2k schematically illustrates the semiconductor device 200 according to further illustrative embodiments, in which the test structure 250T may comprise a plurality of gate electrode structures 205 in combination with adjacent cavities 211, thereby enabling one to "average" over a plurality of resistance values, which may contribute to a reduced spread of the electrical measurement data obtained from the structure 250T and/or to increased measurement sensitivity. It should be appreciated that the corresponding reference structure may therefore also have an appropriate dimensioned lateral distance 243 between the respective contact elements.

Figure 2N:
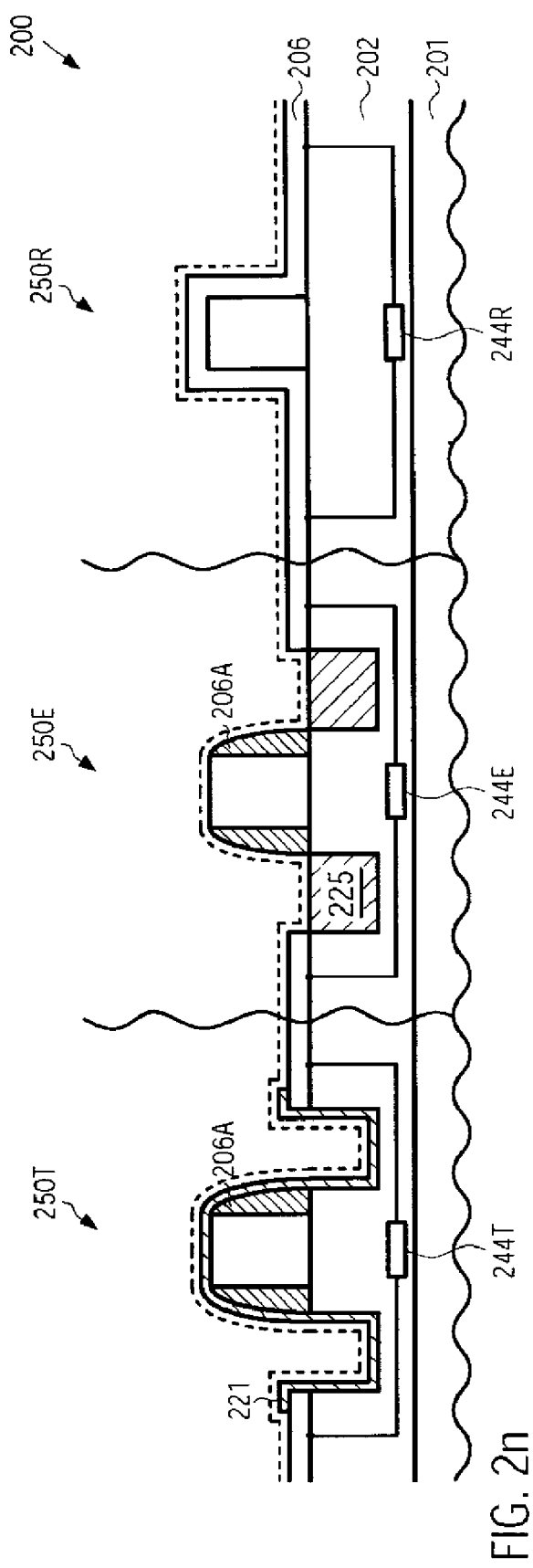

With reference to FIGS. 2l-2n, further illustrative embodiments will now be described, in which an additional test region may be provided that is appropriate for estimating the epitaxial growth process and/or the material produced thereby.

FIG. 2l schematically illustrates the semiconductor device 200, wherein, for convenience, the test area 250S is illustrated only. As shown, the test region 250T and reference region 250R may be provided in an early manufacturing stage, wherein also an additional test region 250E may be provided to enable evaluation of the epitaxial growth process. For this purpose, the spacer layer 206 may be patterned on the basis of the etch mask 208 so as to form respective sidewall spacers 206A in the regions 250T, 250E. Furthermore, the layer 206 may be defined in a manner that is appropriate for forming the cavity adjacent to the gate electrode structures 205 in the test regions 250T, 250E. Thereafter, the cavity etch process may be performed, as previously described.

FIG. 2M schematically illustrates the semiconductor device 200 in a further advanced manufacturing stage, in which the cavities 211 are formed in the regions 250T, 250E and the protection layer 221 is formed in the region 250T within the cavities 211, while the respective cavities 211 in the region 250E may be exposed. For this purpose, the layer 221 may be deposited as previously described and may subsequently be selectively removed by providing a resist mask and using well-established selective etch recipes.

FIG. 2n schematically illustrates the semiconductor device 200 in a further advanced manufacturing stage, in which a semiconductor fill material 225 may be formed in the cavities 211 of the region 250E and also in respective device regions, such as the region 250P (FIGS. 2g-2h), as previously explained. During the corresponding selective epitaxial growth process, the layer 206 and the protection layer 221 may substantially avoid any undue material deposition in the regions 250T and 250R. Thereafter, in some illustrative embodiments, the protection layer 221 may be removed and a further silicon nitride based material may be formed above the test area 250S as indicated by the dashed line. In other illustrative embodiments, the layer 206 and possibly an additional protection layer may be maintained in the test area 250S, while the layer 206 and the respective spacers 206A may be removed in the device region 250D, as previously explained. In other cases, the layer 206 in combination with the spacers 206A, at least in the region 250E, may also be removed along with any such components in the device region 250E. Thereafter, the further processing may be continued, as previously described, i.e., corresponding circuit elements may be completed in the device region 250D, while the test area 250S may be substantially shielded during these processes, as previously explained.

Consequently, upon forming respective contact structures, as previously explained, electric measurement data may be obtained, which may represent the characteristics of the process for forming the cavities 211, as previously explained, while additionally a respective resistance value 244E may represent the characteristics of the material 225 and thus of the corresponding epitaxial growth process. For example, a difference between the resistance values 244E, 244T may substantially represent the contribution caused by the epitaxial growth process, thereby enabling an evaluation of the characteristics of the material 225, for instance, a height thereof in the cavity 211, for a given composition and doping level of the material 225. On the other hand, the characteristics of the cavities 211 may be evaluated, as previously explained. Consequently, an efficient overall evaluation of the process sequence for forming an embedded semiconductor material in drain and source regions of transistor elements, such as strained semiconductor alloys and the like, may be accomplished on the basis of electrical measurement data by using the test structure 250T and 250E, possibly in combination with the reference structure 250R.

With reference to FIGS. 3a-3k, further illustrative embodiments will now be described, in which the epitaxial growth process may be evaluated on the basis of a correspondingly designed test structure including a test region and a reference region.

Figure 3A:
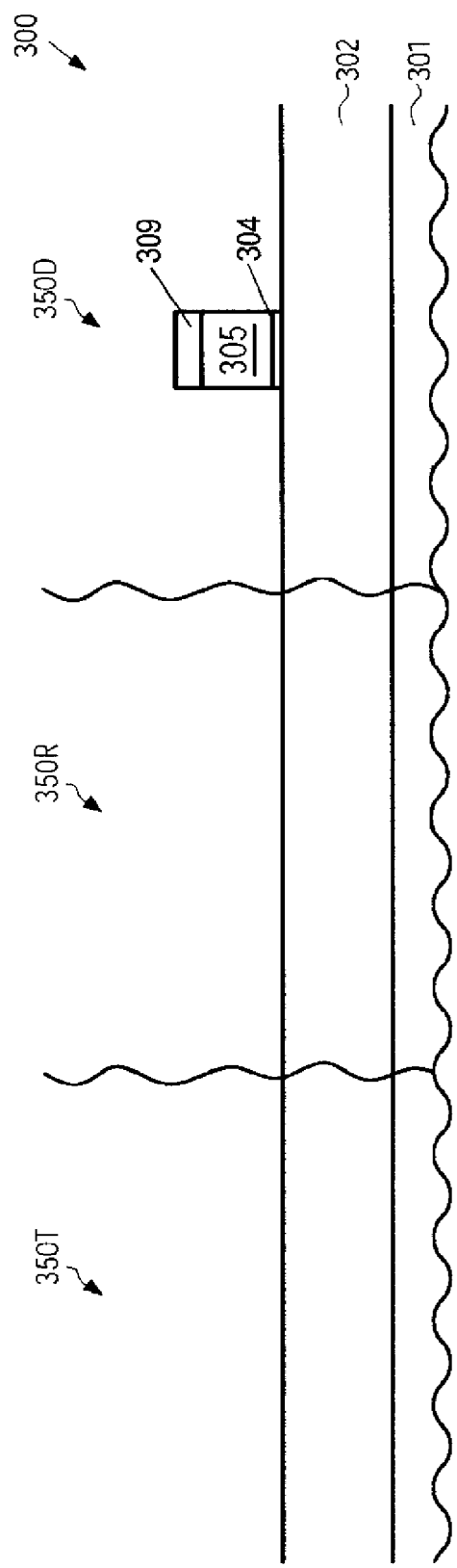

FIG. 3a schematically illustrates a cross-sectional view of a semiconductor device 300 comprising a substrate 301 and a semiconductor layer 302. The device 300 may comprise a test region 350T, a reference region 350R and a device region 350D. In the manufacturing stage shown, a gate electrode structure 305 including a gate insulation layer 304, possibly in combination with a cap layer 309, may be formed above the semiconductor layer 302 in the device region 350D. With respect to the components described so far, the same criteria apply as previously explained with reference to the device 200.

Figure 3B:
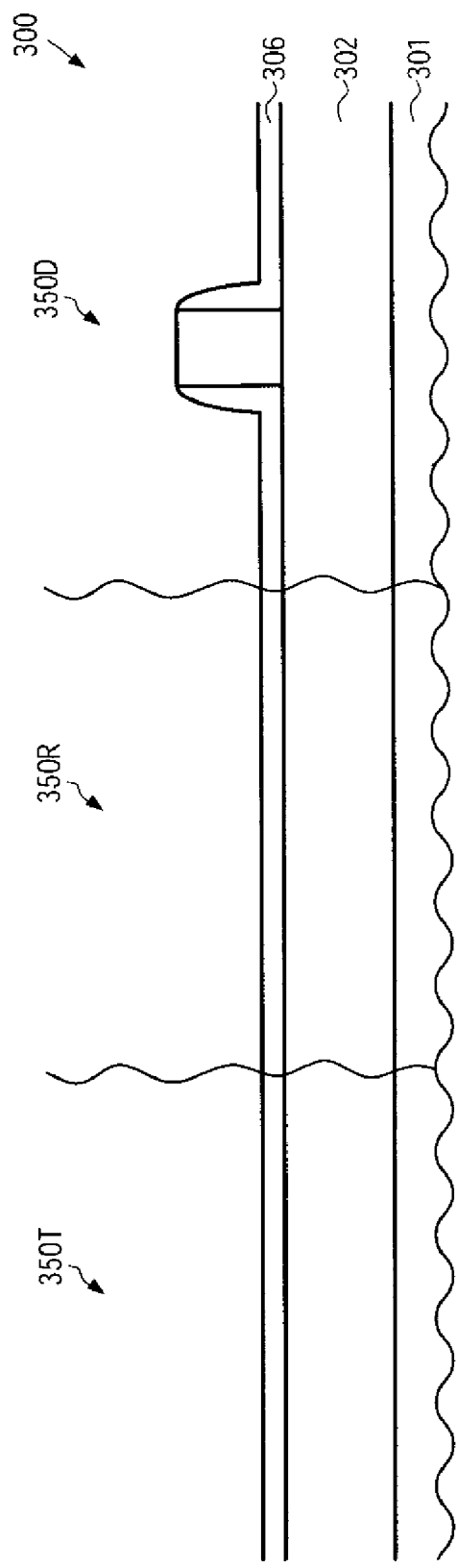

FIG. 3b schematically illustrates the semiconductor device 300 with a spacer layer 306, which may be formed in accordance with respective process techniques as previously described with reference to the devices 100 and 200. It should be appreciated that, if required, the layer 306 may comprise an etch stop layer, as previously discussed.

Figure 3C:
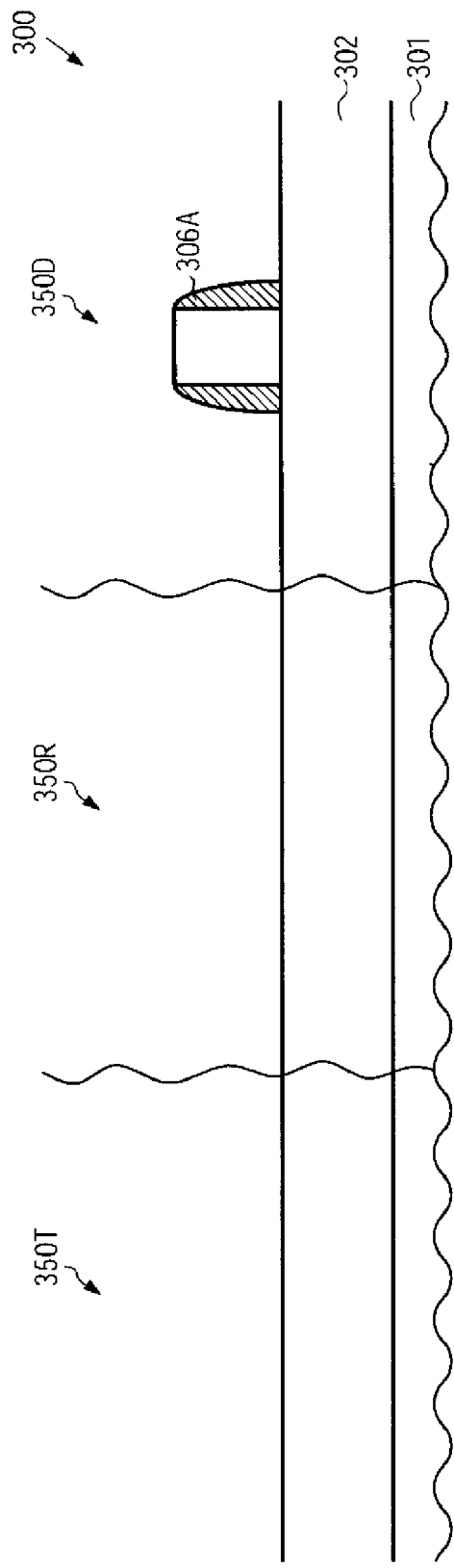

FIG. 3c schematically illustrates the device 300 after patterning the spacer layer 306 to form a spacer 306A in the device region 350D, while completely removing the layer 306 in the regions 350T, 350R. It should be appreciated that the device region 350D may also comprise transistor elements, which may still be completely covered by the spacer layer, as previously explained with reference to devices 100 and 200.

Figure 3D:
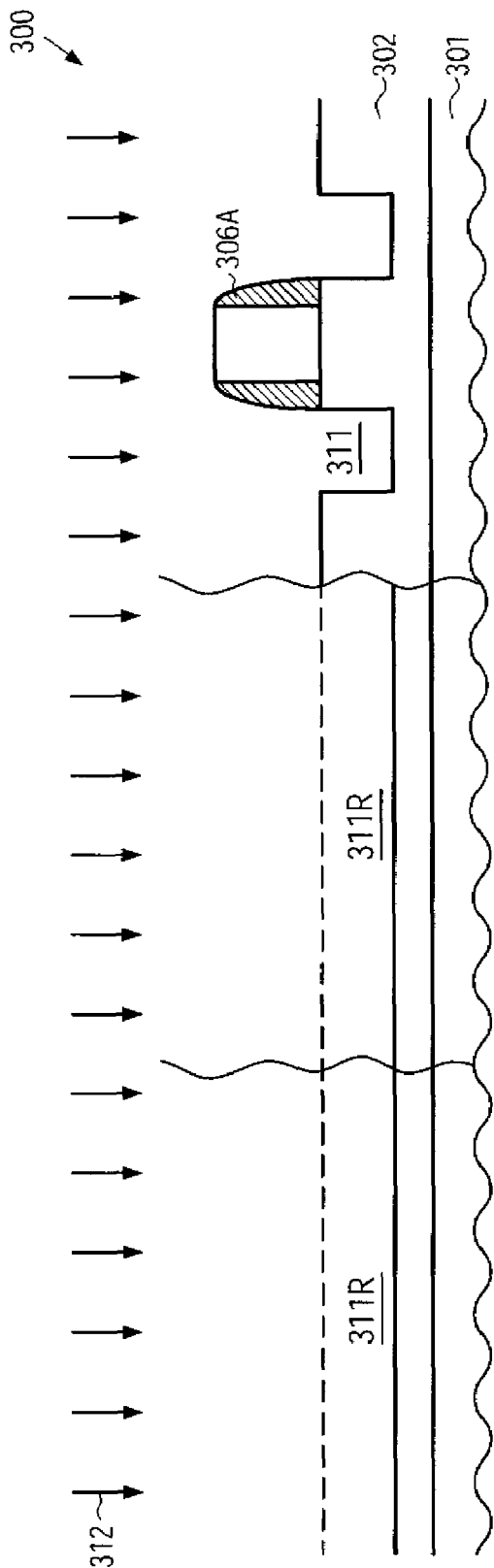

FIG. 3d schematically illustrates the device 300 during a cavity etch process 312 performed on the basis of any appropriate etch recipe, as previously explained, wherein respective cavities 311 may be formed in the device region 350D adjacent to the gate electrode structure 305 including the spacer structure 306A. Similarly, respective recesses 311R may be formed in the regions 350T and 350R. It should be appreciated that the recesses 311R may be formed with a size that is appropriate for the further processing, for instance for forming contact structures in a later manufacturing stage. The lateral dimensions of the recesses 311R may thus be significantly larger than the corresponding size of the cavities 311, and may not be relevant for assessing an epitaxial growth process, irrespective of whether the etch step for forming the cavities 311 and the recesses 311R may result in different process outputs.

Figure 3E:
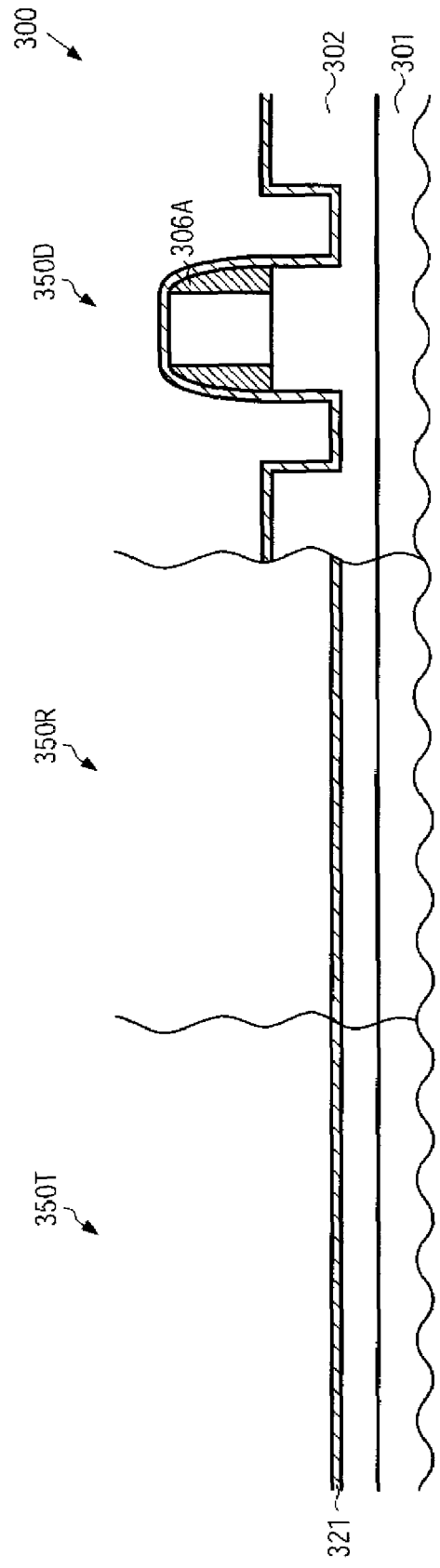

FIG. 3e schematically illustrates the device 300 with a protection layer 321, for instance a silicon dioxide layer, or any other appropriate material, formed on the regions 350T, 350R and 350D.

FIG. 3f schematically illustrates the device 300 in a further advanced manufacturing stage, in which an etch mask 323 may be provided to cover the region 350R, while exposing the regions 350T and 350D to an etch ambient 322 for selectively removing exposed portions of the protection layer 321. Also, in this case, well-established selective etch recipes, for instance, wet chemical recipes, plasma-assisted recipes and the like, may be used, as also previously discussed.

FIG. 3g schematically illustrates the device 300 during a selective epitaxial growth process 324, wherein the protection layer 321 may act as an efficient deposition mask, while also the residues of the layer 306 (not shown) in other areas of the device region 350D may protect respective transistor elements not requiring the semiconductor material grown during the process 324. Hence, the cavities 311 as well as the recess 311R in the test region 350T may be filled with the semiconductor material under consideration according to the characteristics of the epitaxial growth process 324 that is to be evaluated on the basis of the structures 350T, 350R. Thus, a semiconductor fill material 325 may be formed in the cavities 311, while a corresponding material 325T may be formed in the recess 311R. It should be appreciated that one or more characteristics of the materials 325T, 325 may differ from each other, since the deposition conditions may be different in the regions 350T, 350D. Nevertheless, the characteristics of the materials 325T and 325 are strongly correlated to each other, thereby enabling a reliable evaluation of the material 325 on the basis of the material 325T.

FIG. 3h schematically illustrates the semiconductor device 300 according to illustrative embodiments in which a further protection layer 326, for instance comprised of silicon dioxide, silicon nitride and the like, may be selectively formed in the regions 350T, 350R. In other illustrative embodiments, the protection layer 326 may be omitted, when the further process steps in the device region 350D may appropriately be shielded from the regions 350T, 350R by suitably designing the overall process flow. Thereafter, the further processing may be continued by completing the respective transistor structures in the device region 350D, as for instance previously described with reference to the device 200. As explained above, during corresponding manufacturing sequences for completing the transistor structures, the regions 350T, 350R may be efficiently shielded, at least during respective processes that may significantly contribute to a change of electrical characteristics, such as implantation processes, the formation of metal silicides and the like.

FIG. 3i schematically illustrates the semiconductor device 300 in a further advanced manufacturing stage. As shown, respective contact structures 340T, 340R may be formed in the regions 350T, 350R. For convenience, the device region 350D is not shown in FIG. 3i, wherein it should be appreciated that a similar contact structure may be formed in accordance with device requirements, as also explained with reference to the device 200. That is, an appropriate interlayer dielectric material may have been deposited on the basis of well-established techniques and subsequently contact openings may be formed to connect to the contact areas of interest. As shown, the contact structure 340T may comprise a first contact element 341T configured to connect to the epitaxially grown material 325T, while a second contact element 342T may connect to the remaining portion of the semiconductor layer 302. For example, the contact element 342T may represent a contact formed from the back side of the substrate 301, while, in other, cases the layer 302 may be contacted via a front side contact, such as the contact 341T, wherein, however, an appropriate trench isolation may electrically insulate the corresponding contact and the material 325T. Respective contact techniques, for instance on the basis of tungsten and the like, are well established in the art and may be used for this purpose.

Similarly, the contact structure 340R may comprise a first contact 341R connecting to a top surface 302A of the remaining semiconductor material of the layer 302 while a second contact element 342R may connect to a bottom face 302B of the layer 302. Also, in this case, the contact 342R may be provided as a backside contact so as to enable a current flow from the first contact 341R across the semiconductor layer 302 and into contact 342R.

Thereafter, the further processing may be continued by forming respective metallization layers, as previously discussed, wherein an appropriate design may be used to ensure that the contact structures 340T, 340R may be accessible by external electrical measurement equipment. For instance, appropriate contact pads may be formed at any appropriate metallization level to allow contact with respective measurement probes.

Figure 3J:
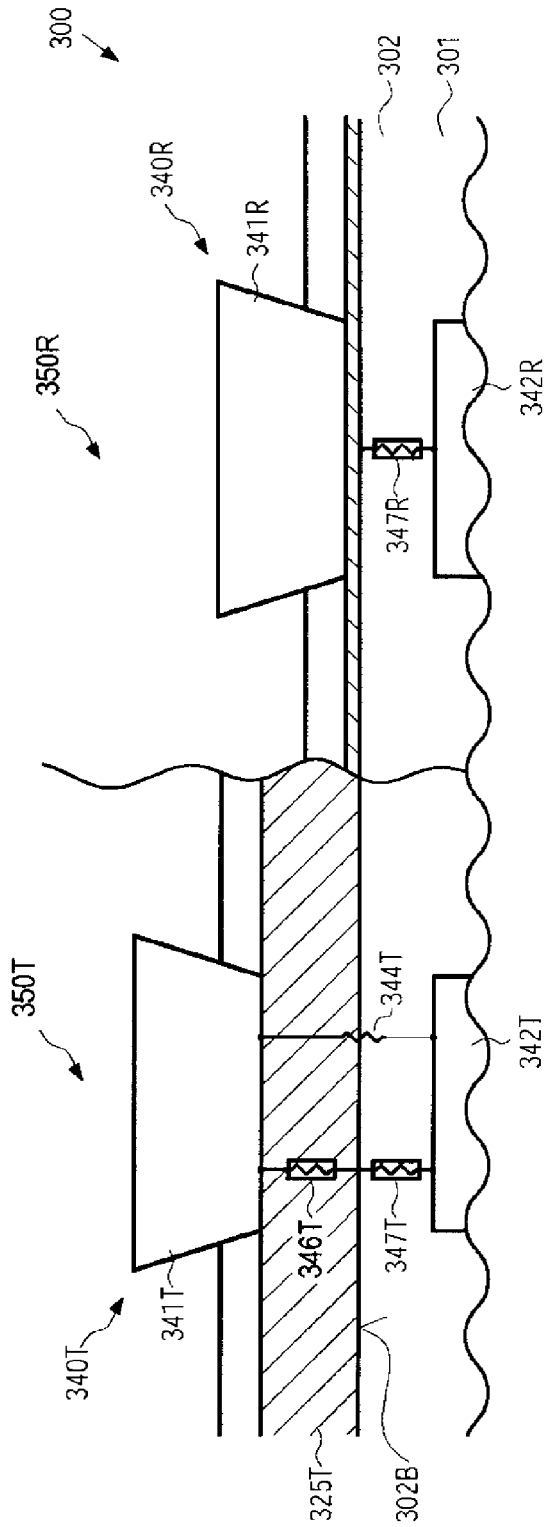
FIG. 3j schematically illustrates the electrical conditions in the test region and the reference region for obtaining electrical measurement data.

FIG. 3j schematically illustrates the device 300 during an electrical measurement procedure, in which a current flow may be established across the materials 325T and 302 in the test region 350T, while a current flow may be established through the layer 302 in the reference region 350R. As shown, except for the influence of the contact structures, which may be identical for the regions 350T, 350R, a total resistance 344T may occur in the region 350T corresponding to the resistive behavior of the remaining portion of the layer 302 and the epitaxially grown material 325T. Thus, the resistance 344T may be comprised of the contributions 347T corresponding to the semiconductor layer 302 and the portion 346T corresponding to the material 325T. Similarly, a resistance value 347R may correspond to the resistive behavior of the semiconductor layer 302 at the reference region 350R. Since the patterning of the regions 350T, 350R during formation of the recesses 311R (FIG. 3d) may have been performed on the basis of very similar process conditions, for instance by positioning the regions 350T, 350R in close proximity to each other, the resistance values 347R and 347T may be substantially equal to each other. Consequently, a difference obtained from the measurement values of the test region 350T and the reference region 350R may substantially represent the electrical characteristics of the material 325T, that is, respective measurement data may indicate the resistance value 346T. Hence, for a given composition of the material 325T, for instance, for a given fraction of germanium, the contents of any dopant species and the like, the resistance 346T may substantially correspond to the layer thickness of the material 325T. In this respect, it should be appreciated that the test region 350T and the reference region 350R may be provided with the same lateral design dimensions so that a corresponding electric measurement data may be directly compared with each other. In other cases, a predefined correlation between the design dimensions may be used for calculating an appropriate electrical measure for material characteristics of the material 325T.

Figure 3K:
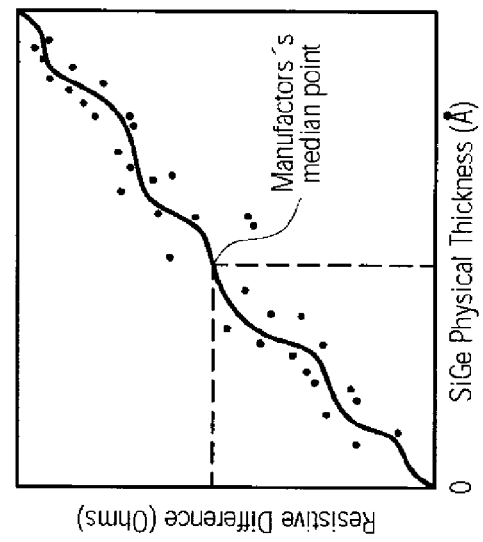
FIG. 3k schematically illustrates a relationship between electrical measurement data and at least one material characteristic, such as the thickness of a strained semiconductor material, according to further illustrative embodiments.

FIG. 3k schematically illustrates a qualitative relationship between the differential resistance, as described above, and a material characteristic, such as the physical layer thickness of the material 325T. It should be appreciated that a corresponding correlation may be calibrated by using optical measurement techniques and/or cross-sectional analysis techniques, as previously described. It is to be noted that a plurality of test regions and reference regions with different dimensions may be provided across the entire substrate to enable an evaluation of the epitaxial growth process for different process conditions and the like.

As a result, the principles disclosed herein provide test structures and techniques for forming the same, as well as strategies for evaluating materials and/or process sequences used for forming embedded semiconductor material in drain and source regions of sophisticated transistors. The test structures are designed to enable access by electrical test equipment, thereby providing an efficient and reliable procedure for obtaining statistically relevant data with high spatial coverage, while reducing the overall time for obtaining the respective measurement data compared to conventional optical measurement techniques and/or cross-sectional analysis techniques. For example, the characteristics of a patterning process for forming respective cavities in transistor areas may be monitored and evaluated, for instance, on the basis of electrical resistance measurements, while, in other cases, material characteristics of the epitaxially grown semiconductor material may be evaluated, thereby also enabling an evaluation of the epitaxial growth process, wherein the usage of an electrically testable structure provides shorter measurement times and more reliable process characterization.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming first cavities in a transistor area of a semiconductor layer;
    forming test cavities in a test region of said semiconductor layer, said first cavities and said test cavities being formed in a common process;
    filling said first cavities with a semiconductor material, while masking a first one and a second one of said test cavities; and
    obtaining electrical measurement data from said test region by establishing a current flow through a first portion of said semiconductor layer comprising said first and second test cavities for evaluating said common process.

2. The method of claim 1, further comprising forming a first contact and a second contact to said test region and forming transistor contacts to a transistor formed in said transistor area prior to establishing said current flow.

3. The method of claim 2, further comprising defining a reference region in said semiconductor layer by forming a first reference contact and a second reference contact to connect to a non-recessed portion of said semiconductor layer.

4. The method of claim 3, wherein said first reference contact and said second reference contact have a lateral distance that is substantially equal to a lateral distance between said first and second contacts.

5. The method of claim 1, further comprising forming a transistor in said transistor area by performing a plurality of processes for modifying a conductivity in said transistor area while substantially avoiding an effect of said plurality of processes on said test region.

6. The method of claim 5, wherein obtaining said electrical measurement data comprises determining an electrical resistance in said portion.

7. The method of claim 3, wherein obtaining said electrical measurement data comprises determining a difference in electrical resistance between said test region and said reference region.

8. The method of claim 1, further comprising forming third and fourth test cavities in said test region and filling said third and fourth test cavities and said first cavities with said semiconductor material in a common fill process.

9. The method of claim 8, further comprising obtaining second electrical measurement data from a second portion of said semiconductor layer comprising said filled third and fourth cavities.

10. The method of claim 1, wherein said common fill process is a selective epitaxial growth process.

11. The method of claim 10, further comprising evaluating at last one of said common fill process and a characteristic of said semiconductor material by comparing said electrical measurement data and said second electrical measurement data.

* * * * *